United States Patent
Okada et al.

(10) Patent No.: US 6,767,827 B1
(45) Date of Patent: Jul. 27, 2004

(54) METHOD FOR FORMING DUAL INLAID STRUCTURES FOR IC INTERCONNECTIONS

(75) Inventors: Lynne A. Okada, Sunnyvale, CA (US); Fei Wang, San Jose, CA (US); James Kai, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/459,328

(22) Filed: Jun. 11, 2003

(51) Int. Cl.[7] .......................................... H01L 21/4763
(52) U.S. Cl. ...................................................... 438/638
(58) Field of Search ................................ 438/638, 637, 438/633, 628, 623, 622, 619

(56) References Cited

U.S. PATENT DOCUMENTS

| | | |
|---|---|---|
| 6,127,089 A | 10/2000 | Subramanian et al. |
| 6,153,514 A | 11/2000 | Wang et al. |
| 6,156,643 A | 12/2000 | Chan et al. |
| 6,204,168 B1 | 3/2001 | Naik et al. |
| 6,207,576 B1 | 3/2001 | Wang et al. |
| 6,207,577 B1 | 3/2001 | Wang et al. |
| 6,235,628 B1 | 5/2001 | Wang et al. |
| 6,255,735 B1 | 7/2001 | Wang et al. |
| 6,291,887 B1 | 9/2001 | Wang et al. |
| 6,294,458 B1 | 9/2001 | Zhang et al. |
| 6,312,874 B1 | 11/2001 | Chan et al. |
| 6,358,838 B2 | 3/2002 | Furusawa et al. |
| 6,365,505 B1 | 4/2002 | Wang et al. |
| 6,368,979 B1 | 4/2002 | Wang et al. |
| 6,507,081 B2 | 1/2003 | Smith et al. |
| 2002/0192944 A1 | 12/2002 | Sonderman et al. |
| 2002/0195715 A1 | 12/2002 | Cho |
| 2003/0008243 A1 | 1/2003 | Ahn et al. |

OTHER PUBLICATIONS

"Accelerator for Microelectronics and Semiconductor Innovation—Damascene Technology", Cyberfab.net, 8 pgs., taken from the Internet at http://www.cyberfab.net/training/selfstudy/damascene_technology_1.html.

"Damascene Copper Electroplating for Chip Interconnections", Electrochemical Microfabrication, P.C. Andricacos, C. Uzoh, J.O. Dukovic, J. Horkans and H. Deligianni, vol. 42, No. 5, 1998, 6 pgs., taken from the Internet at http://www.reasearch.itm.com/journal/rd/425/adnricacos.html.

"Tutorial on On–Chip Interconnect for non–experts", The microelectronics Training Center, Bart De Mey, Feb., 2001, 2 pgs.

*Primary Examiner*—Evan Pert
*Assistant Examiner*—Monica D. Harrison

(57) ABSTRACT

A method for forming a dual inlaid interconnect structure for ICs is disclosed. The method includes forming an etch stop layer, opening a portion of the etch stop layer on an IC die, forming a first dielectric layer, a middle stop layer, a second dielectric layer and a cap layer thereover. The method further comprises patterning the cap, dielectric layers and middle stop layer a via opening down to the etch stop layer that is associated with the opening therein. A trench opening is formed down through the cap and second dielectric layer and stopping on the middle stop layer. The trench/via opening is then filled with a conductive material (e.g., metal). The method may further include forming a barrier layer within the opening of the etch stop layer. According to another aspect of the invention, a first and second etch stop layer are formed over the substrate and the second etch stop layer is patterned to define two regions, wherein a second region having the first and second etch stop layers experiences a faster etch rate than the first region. The first dielectric layer, middle stop layer, second dielectric layer and cap layer are then deposited over both regions and two via openings are formed therethrough in the regions, respectively. The first and second etch stop layers protect the underlying substrate from experiencing punchthrough during the via formation. A trench pattern is then defined in the second dielectric layer and the etch stop layers are then removed in the openings and a conductive material is formed therein.

29 Claims, 19 Drawing Sheets

METHOD FOR FORMING DUAL INLAID STRUCTURES FOR IC INTERCONNECTIONS

FIELD OF THE INVENTION

This invention relates generally to semiconductor processing, and more particularly to a method and process for dual inlaid structures for integrated circuit interconnections.

BACKGROUND OF THE INVENTION

Integrated circuits (ICs) are formed on semiconductor substrates using a number of different processing steps to create transistor and interconnection elements. In order to electrically connect transistor terminals associated with the semiconductor substrate, conductive (e.g., metal) vias (vertical channels) and interconnections (interconnects) are formed in dielectric (electrically insulating) materials as part of the integrated circuit. The vias and interconnects couple electrical signals and power between transistors, internal circuits of the IC, and circuits external to the IC.

Dual inlaid ("damascene") interconnect processes for semiconductor devices are replacing conventional blanket metal deposition and etch processes. Traditionally, metal films have been deposited and patterned using photolithography techniques to form patterned metal interconnects overlying a semiconductor substrate. As interconnect geometry sizes decrease and as conductive lines are formed closer together, it becomes increasingly difficult to accurately pattern the conductive lines and form the conductive interconnects using the traditional blanket deposition and patterning processes. Consequently, inlaid metal interconnect processes have been developed to overcome some of these problems.

An example of a conventional self-aligned dual damascene process is depicted in prior art FIGS. 1A–1E. FIG. 1A shows an etch stop layer ("ESL") 13, such as silicon nitride, that is deposited over an existing interconnect pattern formed in an interconnect layer 10. The interconnect layer 10 may include a patterned conductive material 12, such as copper. A layer of low-k dielectric material 16 is then deposited on the bottom ESL 13. A middle stop layer ("MSL") 18, such as silicon dioxide or SiN, is deposited over the low-k dielectric material 16. A via pattern 19 is then etched into the MSL 18 using conventional photolithography and etching techniques, as illustrated in FIG. 1A.

A second layer of low-k dielectric material 22 is deposited or spin-coated on the MSL 18 and the opening 19 formed in the MSL 18. A cap, or hard mask layer 24, such as silicon dioxide or SiON, is then deposited on the dielectric layer 22, as illustrated in prior art FIG. 1B.

A trench and via pattern is then formed using conventional photolithography techniques, for example, with a photoresist and an anisotropic dry etch. A first anisotropic dry etch etches through cap layer 24, followed by a second anisotropic dry etch 25 that etches through dielectric layers 22 and 16 but not the cap layer 24, MSL 18 or ESL 13. The second etch 25 results in the formation of a trench 26 and a via 28, as illustrated in prior art FIG. 1C.

In prior art FIG. 1D the exposed portion of the ESL 13 is then removed by a different etch, etch 27, to expose the conductor 12 so that the conductor may connect to overlying conductive lines through the trench 26 through the via 28, respectively.

Following formation of the trenches and vias, a conductive material 30 may be deposited through any of numerous conventional means into the opening and polished back by CMP to level 32. Cap layer 24 serves as a stop layer during CMP, as illustrated in prior art FIG. 1E.

Removing the ESL layer 13 from the trenches 26 and the vias 28 prior to filling them with conductive material creates several deleterious effects. In particular, when the ESL layer 13 is etched from the via 28, the cap layer 24 and the MSL 18 are also etched to some degree, causing the corners of the cap layer and MSL to become rounded near the trenches 26 and vias 28. The cap 24 and the MSL 18 must therefore be thick enough to survive the ESL etch and protect the underlying ILD layers 16 and 22. Utilizing thick cap and middle layers, however, comes at the expense of the dielectric constant of the "stack" (i.e., the layers of the ESL, ILDs, MSL, and cap). Because the thickness of the cap 24 and the MSL 18 depend, in part, on surviving the ESL etch, the layers are not necessarily optimized to have the lowest dielectric stack constant. Further, non-uniform ESL etching from feature loading effects may lead to poorly defined trench heights.

In addition, corner rounding induced during the via definition of the MSL 18, as illustrated in FIG. 1A, may further complicate the final profile and require additional thickness increases in the MSL 18 to insure that the corners can survive the subsequent etches. Increased thickness of the MSL 18, however, undesirably leads to a higher dielectric constant of the stack.

An additional complication that needs to be considered is the transition from relatively thick 248 nm photoresists to thinned 248 nm photoresists, 193 nm photoresists, and even bi-layer or tri-layer photoresists. Each of these changes can lead to complications since robustness to the etch process is significantly different in each of these scenarios.

Additionally, after the trenches 26 and vias 28 are filled with the conductive material 30, a top surface 32 thereof must be polished back to the hard cap layer 24 in order to remove the metal from the surface and isolate the interconnect patterns. The corner rounding of the cap layer 24 may require additional polishing of the conductive layer 30 to isolate the interconnect patterns, and such additional polishing may damage the underlying ILD layer 22. As interconnect patterns become more dense, corner rounding of the cap layer 24 leads to increasingly thick cap layers or dual layers to compensate for the additional polishing needed to isolate the interconnect features.

Further, the ESL etch can cause ILD attack and modification due to the etchant contacting the sidewalls of the ILD trenches 26 and vias 28. This attack on the ILD layer sidewalls may lead to a higher dielectric constant of the stack and decreased performance of the interconnect patterns. Also, under-layer sputtering of copper (when copper is employed as the underlying conductive structure 12) on the ILD layer sidewalls may increase electromigration and leakage of copper within the structure.

A further problem of conventional dual inlaid metal interconnect processing is feature dependent loading effects during the etch process. Further, certain areas, such as near the die seal or lithography alignment marks, can etch significantly faster than other areas of the die. This difference in etch rate can lead to punch through of the ESL 13 in the fast etching areas. Further, these fast etching areas can have charge build-up which can result in conductor charging and explosion.

Therefore, a method and process for dual inlaid processing is desired that allows for optimal thickness of the cap and MSL materials to improve the dielectric constant of the stack, requiring less polishing to isolate features (e.g. less corner rounding), and allows for the use of single layer photoresists. It is also desired to provide a method that minimizes ILD attack and modification, and prevents underlying sputtering on the ILD sidewalls to improve the dielectric constant and electromigration performance of the stack. Further, it is desired to optimize the ESL for electromigration performance, decreased dielectric constant, and prevent possible punch through of the ESL layer during the ESL etch.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its sole purpose is to present some concepts of the invention in a simplified form as a prelude to the more detailed description that is presented later.

According to one aspect of the present invention, a method is provided for forming a dual inlaid structure for an IC interconnect. The method includes forming an etch stop layer over an integrated circuit substrate structure, forming an opening in a portion of the etch stop layer, and forming a first ILD, a MSL, a second ILD and two cap layers over the etch stop layer and the opening formed therein. The method further includes forming a photoresist pattern over the cap layers, and etching the top cap layer to form an opening therein that will correspond to a trench. Another photoresist is then formed, patterned and employed as a mask to pattern the bottom cap layer to form an opening therein that will correspond to a via. The bottom cap layer is then employed to form a via down to the substrate through the second ILD. The top cap layer is then employed to pattern the bottom cap and second ILD to form a trench which stops on the MSL. Simultaneously or concurrently to opening the bottom cap, a portion of the MSL is etched, opening and defining the via therein. The via ILD is then etched simultaneously or concurrently with the trench ILD to define the via opening. This method is known as the trench first dual hard mask approach. According to another aspect of the present invention, the methodology includes forming openings in the dielectric and cap materials that are aligned substantially with the etch stop layer opening, and filling the opening with a conductive material, for example, metal.

The method for forming the inlaid structure may further include forming a barrier layer within the opening of the etch stop layer prior to forming the layer of dielectric material over the etch stop layer, and removing a portion of the barrier layer that does not fill the exposed etch stop layer opening. The barrier layer comprises, for example, tantalum, and the dielectric material comprises SiLK or another material with a dielectric constant of approximately 3.0 or less, for example. The cap layer has a thickness of, for example, less than about 2000 A. The photoresist mask used to etch the cap layer and the interlevel dielectric (ILD) layer is, in one example, a single layer, and the pattern of the photoresist is, in one example, aligned with openings of the etch stop layer. The conductive material filling the via or trench comprises, for example, copper.

According to another aspect of the present invention, a method is provided for forming an integrated circuit interconnect structure. The method includes forming a first etch stop layer on an integrated circuit structure, forming a second etch stop layer (ESL) on the first etch stop layer, patterning the second ESL so that it remains in the areas on the die that, due to the feature dependent loading effect, for example, etch quickly. A layer of dielectric material is then formed over the first ESL and the second patterned ESL. A MSL, another layer of dielectric material and a cap layer are formed over the first layer of dielectric material. A photoresist mask is then formed over the cap layer, and the cap, second layer of dielectric material, MSL and first layer of dielectric material are etched, stopping on or in the second patterned ESL layer in the fast etching areas and in the first ESL layer in the slower etching areas. A trench photoresist mask is then utilized to further pattern the trench dielectric level with final removal of the ESLs. The dual damascene pattern is then filled with a conductive material, such as copper.

The method may further include etching the first and second etch stop layers from the pattern where the first and second etch stop layers may be the same or different materials. The first etch stop layer may have a lower dielectric constant than the second etch stop layer, and the thickness of the first etch stop layer may further be based upon the electromigration performance of the first etch stop layer material.

All examples of the present invention highlighted herein are applicable to both via and trench damascene patterning, and both such processes are contemplated as falling within the scope of the present invention.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

In accordance with the present invention, a method is provided for forming a dual inlaid structure, for example, for an IC interconnect. In one aspect of the present invention, the method reduces corner rounding of the cap layer and the MSL, and reduces ILD layer attack caused in conventional processes where the ESL is etched from the via. These advantages are achieved by patterning the etch stop layer (ESL) prior to the depositions of the ILD, the MSL, and the cap layers and the formation of the trenches and vias. Patterning of the ESL prior to formation of ILD, MSL and the cap layers allow for thinner cap and MSL layers. Further, in one example, the opening formed in the ESL is filled with a barrier layer to prevent electromigration and reduce the need for precise alignment of the ESL and via etches. In another example of the present invention, the probability of ESL etch-through is reduced, thereby advantageously allowing for an improved stack dielectric constant by using a first and second ESL. Specifically, patterning the second ESL in areas where the etch performs more quickly reduces the likelihood of etching through the ESL. Further, the dielectric constant is improved by selecting the first ESL based on its dielectric constant and EM (electromigration) performance, and the second ESL based on its ability to stop the etch.

Briefly, FIGS. 2 and 3A–3H illustrate an exemplary method for a dual inlaid structure according to one aspect of the present invention. In this example, the trench is formed prior to via formation. In another example (e.g., FIGS. 4 and 5A–5H), the trench and via may be formed in one step (self-aligned), which may provide benefits over conventional dual inlaid methods. The cap layer, or hard mask, and the MSL may be thin compared to the prior art to improve the overall dielectric constant of the stack as well as minimize any over-polishing necessary to isolate features because of corner rounding. The ILD sidewalls undergo less under-layer sputtering that may improve electromigration performance and better preserve the low dielectric constant of the ILD layer.

FIGS. 2 and 3A–3H illustrate an exemplary method 100 for a dual inlaid structure according to one aspect of the present invention. While the exemplary method is illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the method may be implemented in association with the apparatus and systems illustrated and described herein as well as in association with other systems not illustrated.

Figure 1A:
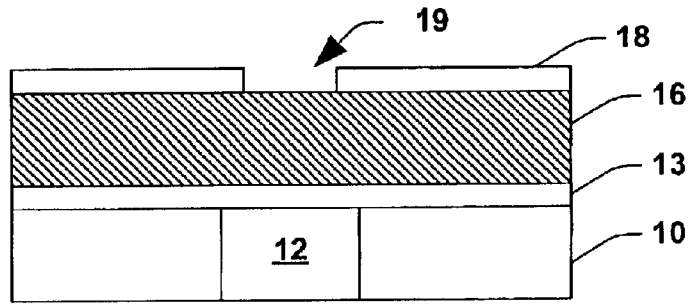
FIGS. 1A–1E are fragmentary cross section diagrams illustrating a prior art method of forming a dual inlaid structure.
Figure 1B:
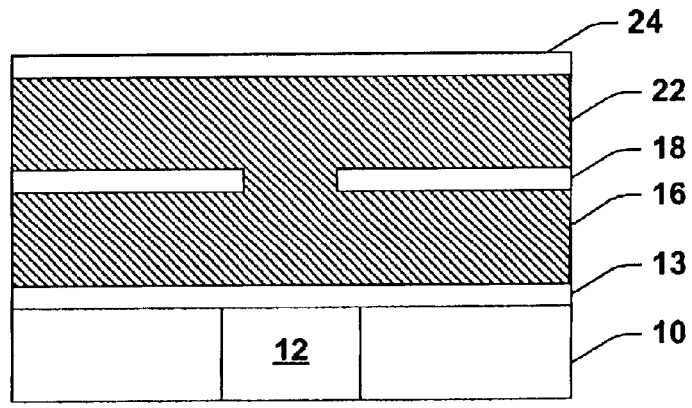
Figure 1C:
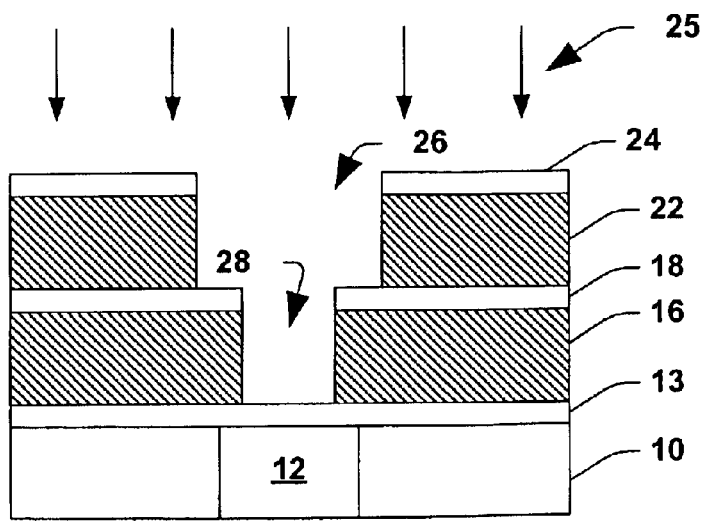
Figure 1D:
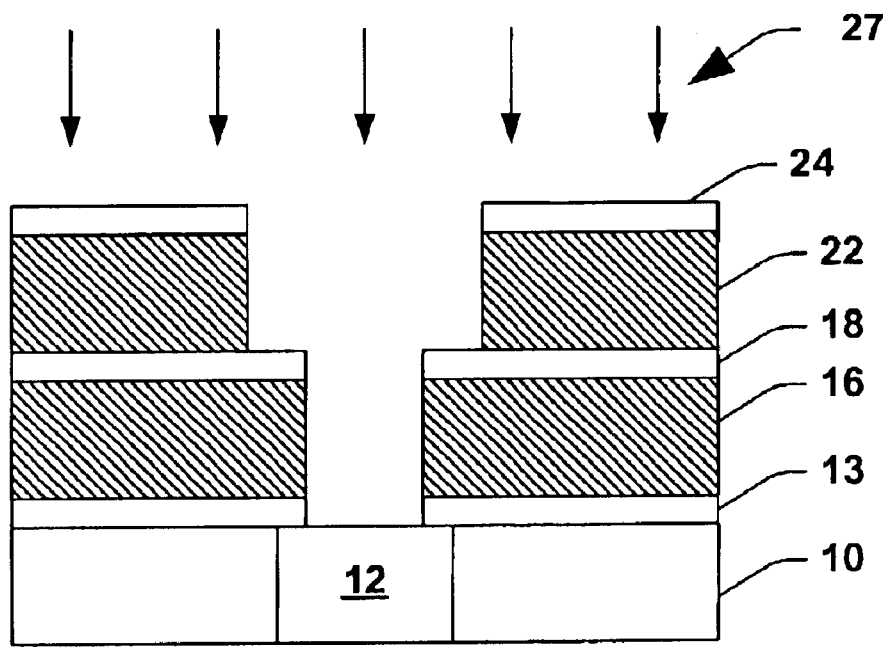
Figure 1E:
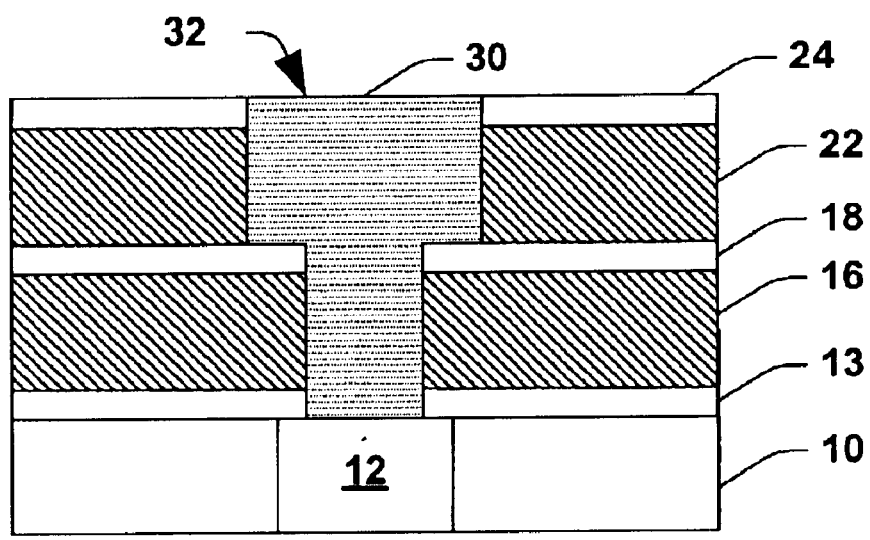
Figure 2:
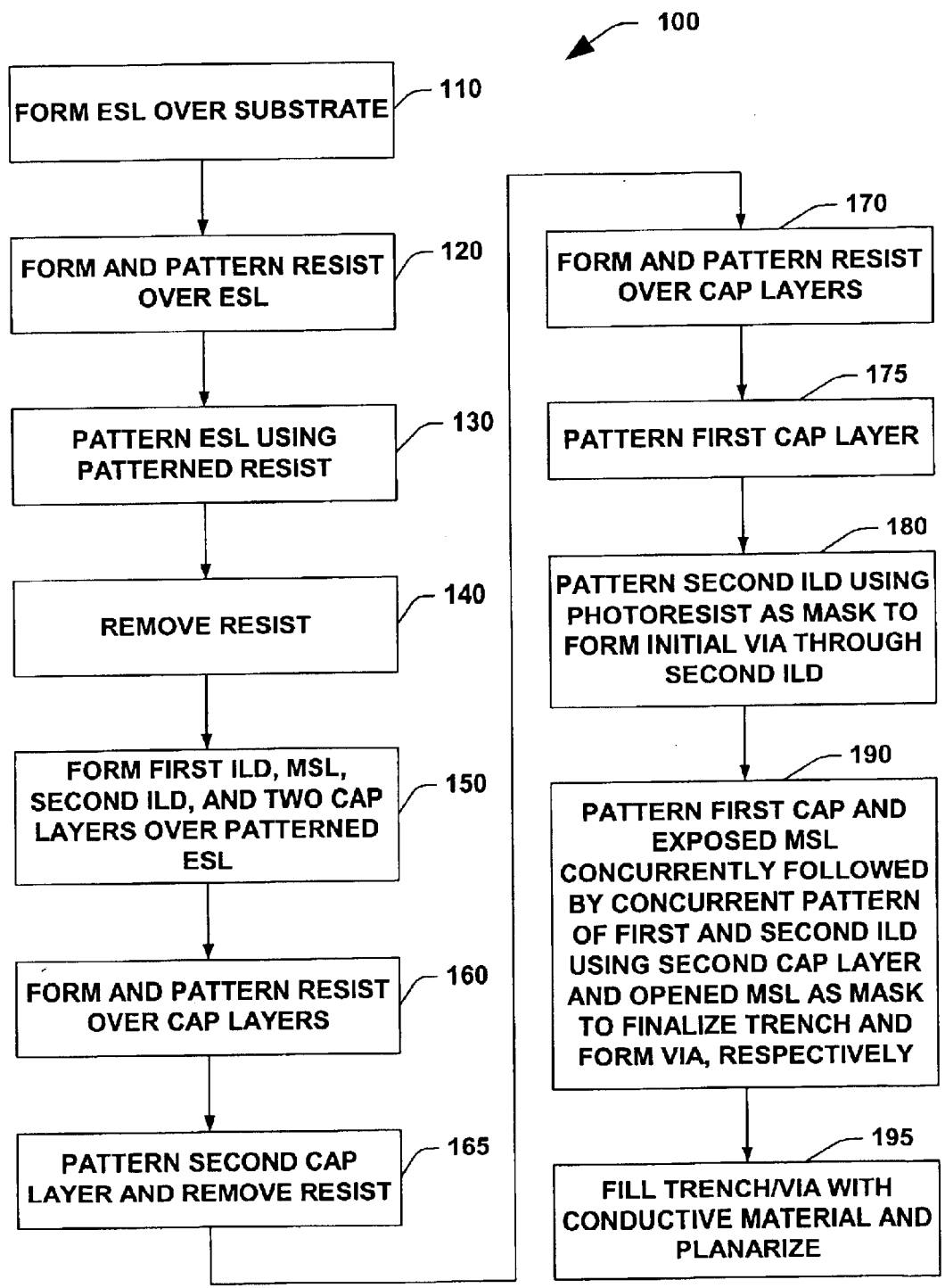
FIG. 2 is a flow chart diagram illustrating a method of forming a dual inlaid structure according to one aspect of the present invention.

Referring initially to FIG. 2, the method 100 comprises forming an ESL over a substrate at 110. The substrate may comprise, for example, an underlying dielectric layer having one or more conductive structures residing therein. A photoresist is then formed over the ESL at 120, for example, via spin-coating. The photoresist is also patterned at 120, for example, by selectively exposing the photoresist to radiation followed by development thereof according to known techniques. The portion of the ESL exposed by the patterned photoresist is then patterned at 130 using the patterned photoresist as a mask. In one example, the ESL is patterned at 130 via a dry etch process that is substantially selective to the underlying substrate material which may be, for example, copper or tungsten. The patterned photoresist is then removed at 140.

The method 100 of FIG. 2 continues at 150, wherein a first inter-layer dielectric (ILD), a middle stop layer (MSL), a second ILD, and two cap layers are formed over the patterned ESL in succession. A photoresist layer is then formed over the cap layers at 160, and the top (or second) cap layer is patterned at 165 to have an opening therethrough that generally corresponds to the opening within the underlying ESL. The remaining photoresist is subsequently removed. In one example, the opening is larger than the ESL opening, wherein the ESL opening generally corresponds to a via opening size while the top cap layer opening generally corresponds to a trench opening size, as will be further appreciated.

At 170, another photoresist is formed and patterned over the cap layers and used to form an opening in the lower cap layer at 175 (the first cap layer), wherein the opening therein is smaller than the opening in the second cap layer. The second ILD is then patterned at 180 using the patterned photoresist (if not removed) and the opened first cap layer as a mask to define a via opening (generally corresponding to the opening in the ESL). The first cap layer and exposed MSL are patterned concurrently, followed by concurrent patterning of the first and second ILD layers. The trench width is defined by the cap layers and the via width is defined by the opened MSL. The process 100 may then continue at 195 by the deposition of a conductive material into the trench/via combination, followed by a planarization process, for example, CMP.

Figure 3A:
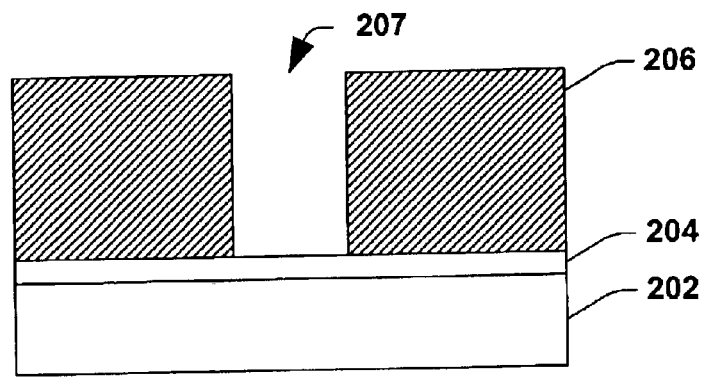
FIGS. 3A–3H are fragmentary cross section diagrams illustrating one example of forming a dual inlaid structure according to the method of FIG. 2.

Turning now to FIGS. 3A–3H, cross sectional diagrams are provided illustrating the method 100 in accordance with one example. In FIG. 3A an etch stop layer, ESL 204, is formed over a substrate 202 in a conventional manner. The ESL 204 traditionally serves to stop the etch from etching into the substrate 202 and prevents copper migration or diffusion. The substrate 202 comprises, for example, another formed layer on a semiconductor substrate (die) or other integrated circuit structures such as an IC die with transistor regions therein overlain by a transistor gate layer, and may include a copper structure. The ESL 204 comprises, for example, silicon nitride (SiN), silicon carbide (SiC), silicon carbide nitride (SiCN), or any other suitable materials known in the art to prevent copper migration and with a different etch selectivity than the subsequent ILD layer. For example, the ESL 204 may comprise BLOk, an etch stop film manufactured by Applied Materials, Inc., and conventionally applied to a thickness of about 500 Angstroms. A photoresist layer 206 is then formed and patterned in a conventional manner over the ESL 204 to define an opening 207 that will be formed in the ESL 204. The photoresist 206 can be of a standard thickness, however, a very thin photoresist layer of, for example, about 500–2000 Angstroms, in this first masking step may be preferred to minimize copper oxidation, sputtering and damage during the photoresist removal.

Figure 3B:
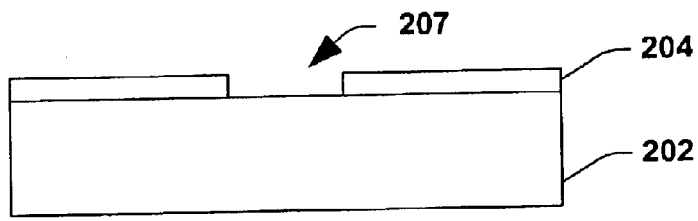

FIG. 3B illustrates the ESL 204 having the opening 207 therein after a subsequent ESL etch using a fluorocarbon dry etch process and stripping off the remaining photoresist layer. As shown, the ESL 204 is opened in the area 207 where the via will be formed. In contrast to conventional methods, the ESL 204 is opened prior to the deposition of an ILD layer (and cap layer) on the ESL 204. The thickness of the ESL 204 is therefore determined primarily by its copper diffusion properties and not its ability to stop the etch, thus allowing the ESL 204 to be thinner than conventional ESLs, which advantageously aids in keeping the dielectric constant of the stack low. The thickness of the ESL 204 is, for example, in the range of about 300–700 Angstroms.

Figure 3C:
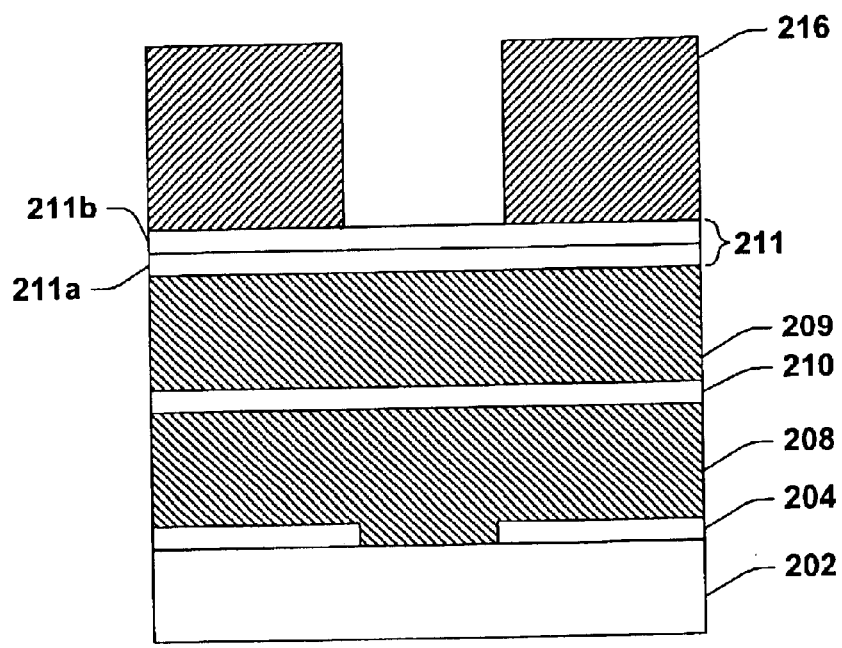

Next, an interlayer dielectric (ILD) 208 and a MSL layer 210 are deposited over the ESL 204 and the substrate 202 in FIG. 3C. The ILD 208 comprises, for example, silicon dioxide ($SiO_2$), an inorganic MSQ-based material, an organic polymer, or other known dielectric material, such as SiLK®, a dielectric polymer manufactured by Dow Chemical Company. The material of the ILD layer 208 is generally chosen to minimize the dielectric constant of the stack, comprising the ESL 204, ILD 208, MSL 210, ILD 209 and cap layer 211. A high dielectric constant may undesirably cause capacitance coupling or "cross talk" between features as the interconnect density is increased. A dielectric constant value of less than 3.0 is generally desired for the ILD layer 208.

The MSL 210 can be formed thinner than with conventional inlaid structures because the MSL 210 does not have to survive the etch to open the ESL 204 since the ESL in the present invention has already been patterned. The MSL 210 may comprise, for example, silicon carbide or another suitable middle stop material. A thin MSL is desirable to reduce the dielectric constant of the stack, and in one example may be formed to a thickness of about 100–300 Angstroms as compared to a conventional MSL of about 300–1000 Angstroms. A second ILD layer 209 is then formed over the MSL 210 and, in one example, may comprise the same material and have the same thickness as the first ILD 208, however, other materials and thicknesses may be employed and are contemplated as falling within the scope of the present invention.

As further illustrated in FIG. 3C, a cap layer 211 comprises a first and second cap layer formed over the second ILD 209. In one example, the cap layer 211 can be formed thinner than in conventional inlaid structures because the cap layer 211 does not have to survive the etch to open ESL 204. The cap thickness may be reduced to have a combined thickness of about 700–2000 Angstroms versus traditional cap thickness requirements of about 1500–4000 Angstroms. The cap layer 211 is, for example, a silicon oxide or silicon oxide nitride (SiON). In one example, the cap layer 211 comprises an oxide layer 211b (a second cap layer) over a silicon oxide nitride layer 211a (a first cap layer). A thin cap layer 211 is desirable because the cap layer material generally has a higher dielectric constant value than the ILD layer 208 and ILD 209, and thus it is desirable to minimize the impact of the cap on the stack dielectric constant.

In conventional processes, the cap layer is further rounded at the corners of the trench by the eventual ESL etch. The corner rounding effect associated with the prior art disadvantageously requires more polishing to remove the metal layer during planarization to isolate the interconnect features. The corner rounding further requires the cap layer to be formed of sufficient thickness to survive the ESL etch. Therefore, the method of the present invention allows one to optimize the cap layer 211 thickness, material, etc. for low dielectric constant values that is otherwise compromised because of the corner rounding caused by the ESL etch of the prior art.

Figure 3D:
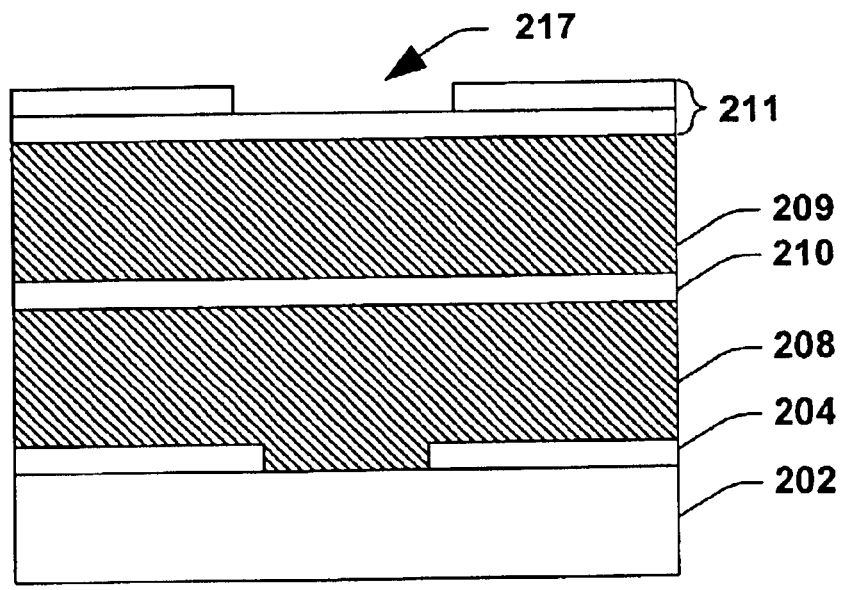

Further, a second photoresist 216 is then deposited and patterned over cap layer 211 in FIG. 3C. An etch is then performed to etch the top portion 211b of the cap layer 211 as shown in FIG. 3D that will subsequently define the trench opening 217 in the ILD layer 209. In one example, the photoresist 216 is aligned with the opening 207 in the ESL 204 to define the opening of the trench and via and prevent subsequent copper migration (i.e., to align the first and second etches). The etch can be performed using a fluorocarbon-based dry etch process in a commercially available dielectric etch tool.

Figure 3E:
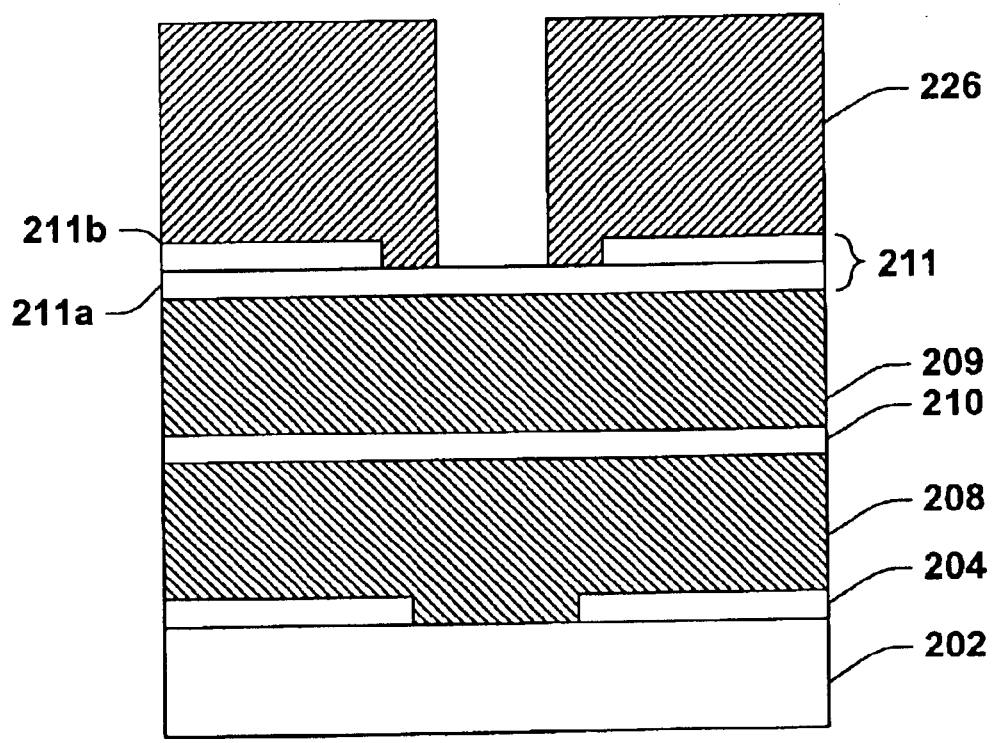
Figure 3F:
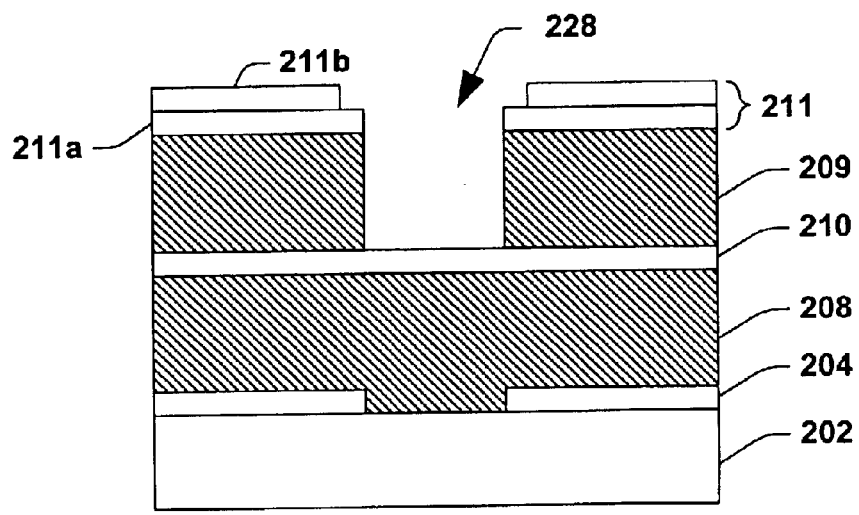

In FIG. 3E, a second photoresist 226 is then deposited and patterned over the cap layer 211. The photoresist pattern 226 is patterned to define the eventual via width. An etch is then performed to etch through the exposed portion 211a of the cap layer 211 and through the top ILD layer 209 in FIG. 3F. The etch can be performed using a fluorocarbon-based dry etch (e.g., $CF_4/O_2/Ar$) followed by an oxidizing ($O_2$ based) or reducing etch (e.g., $N_2/H_2$) in a commercially available plasma etcher.

Figure 3G:
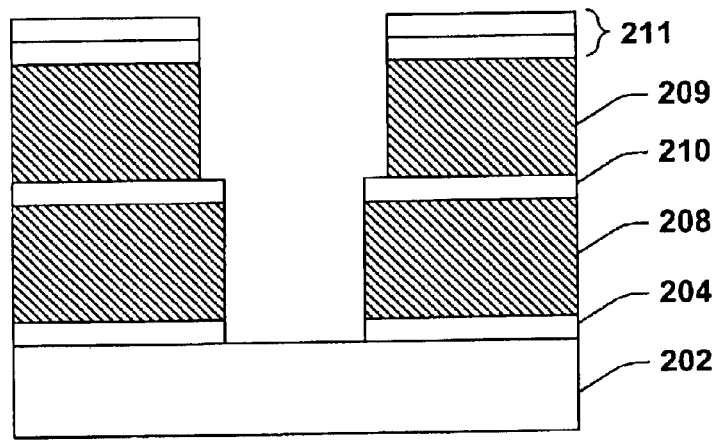
Figure 3H:
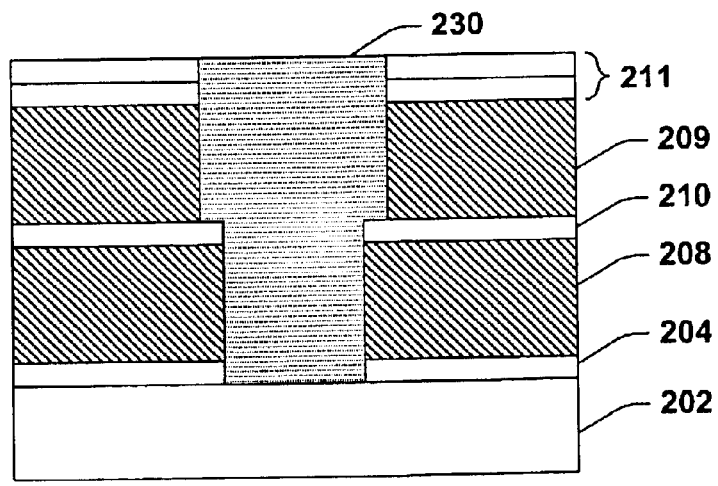

In FIG. 3G, the portion 228 of the MSL 210 exposed through the cap layer 211 and the top ILD layer 209 is etched away using a fluorocarbon-based etch (such as $CH_2F_2/Ar/O_2$) in a plasma etcher. The etch also removes the exposed second portion 211a of cap layer 211 such that cap layer now defines the width of the trench.

A further etch is then performed in FIG. 3G to remove a portion of ILD layer 208 below the opening in the MSL 210 to define the via, and remove a portion of ILD layer 209 above the MSL and below the opening in the cap layer 211 to define the trench. This etch can be performed using a reducing process (such as $N_2/H_2$) in a dielectric plasma etcher.

Finally, as with the conventional damascene methods, a layer of conductive material 230 is then deposited over the patterned dielectric layer and into the via and trench, filling the trench and vias. A barrier layer and seed layer (not shown) may also be deposited over the structure prior to the conductive material 230 deposition. Any conductive material on the surface of the cap layer and not in the trenches and vias is then removed via planarization, for example, leaving the desired pattern of interconnects. Conductive material 230 is removed, for example, by chemical mechanical polishing (CMP) or other conventional methods. Removing conductive material 230 from the surface isolates the trench and via structures. Conductive material 230 comprises, for example, copper or other suitable conductive material known in the art.

In accordance with another aspect of the present invention, a method of forming a dual inlaid structure is provided. In this example, the ESL is patterned prior to ILD formation in a manner similar to that in FIGS. 2 and 3A–3H. The present example, however, differs in that the MSL is patterned prior to formation of a second ILD and a cap layer. For example, in FIG. 4, the method 300 comprises forming and patterning an ESL over a substrate at 310. As discussed previously, the substrate may comprise various materials, and the patterning of the ESL may be performed via a photoresist in accordance with various techniques such as conventional photolithography techniques.

Figure 4:
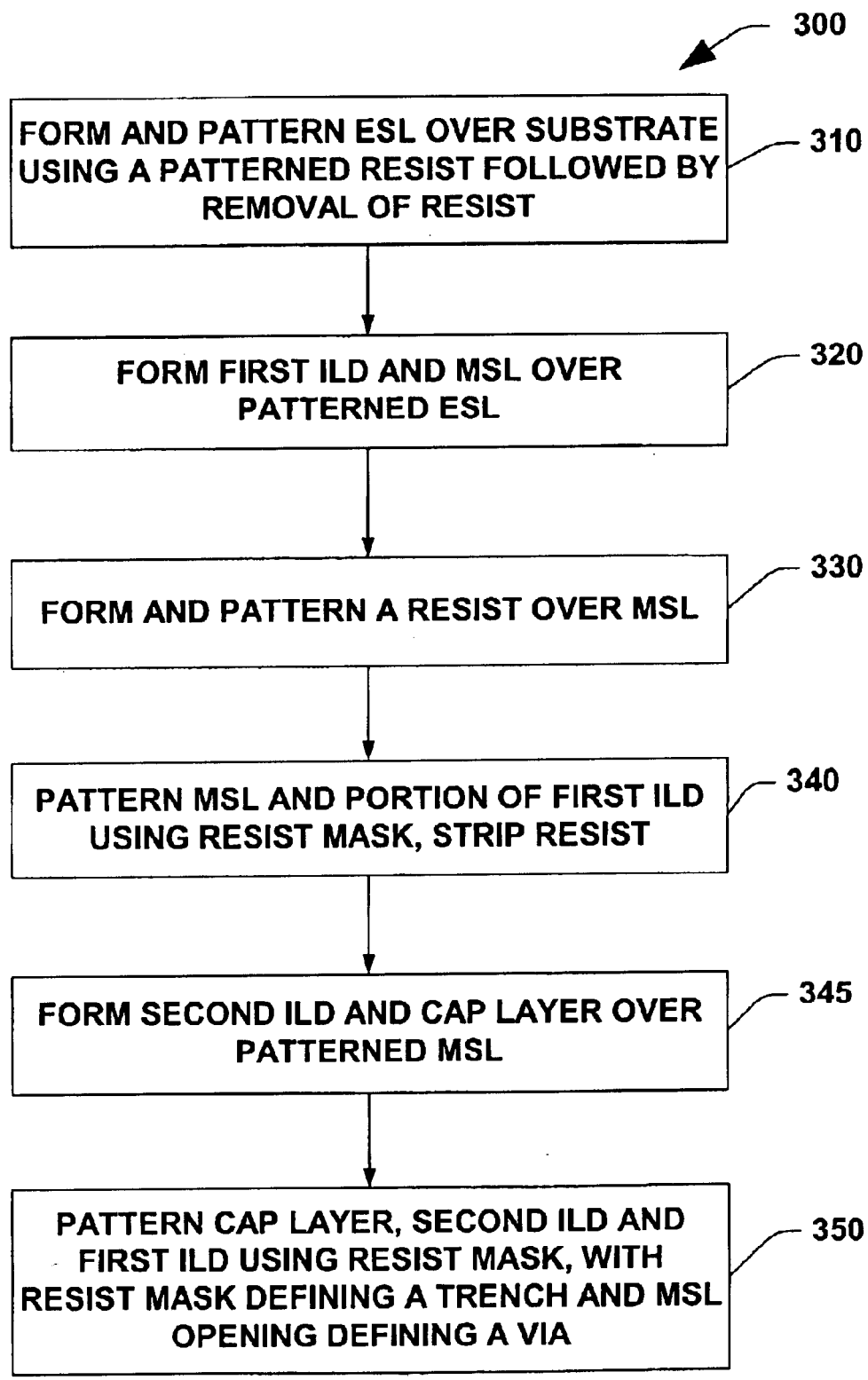
FIG. 4 is a flow chart diagram illustrating a method of forming a dual inlaid structure according to another aspect of the present invention.

The method 300 of FIG. 4 continues at 320, wherein a first ILD and the MSL are formed over the patterned ESL in succession. A photoresist layer is then formed over the MSL at 330, and an exposed portion of the MSL (and in one example a portion of the underlying ILD) is removed at 340. In a preferred example, the portion of the MSL that is removed at 340 substantially corresponds to the opening in the underlying ESL, for example, is approximately the same size (corresponding to a via) and is substantially aligned thereto.

The method 300 continues at 345, wherein a second ILD and a cap layer is formed over the patterned MSL. The cap layer, the second ILD and the remaining portion of the first ILD exposed through the MSL are then patterned using a mask such as a resist mask at 350. In one example, the resist mask has an opening associated therewith that is sized to correspond to a trench such that the opening formed down to the MSL defines a trench while the MSL serves as an etch stop and the remaining patterning of the first ILD defines a via down to the substrate.

Figure 5A:
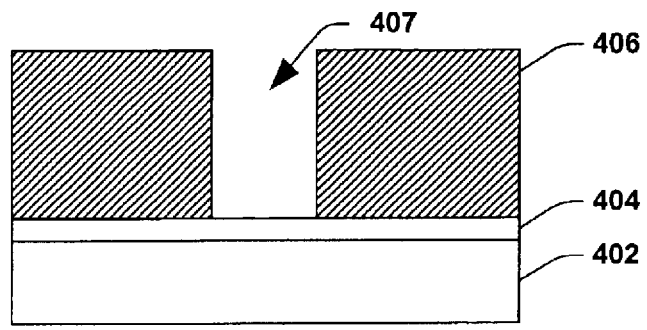
FIGS. 5A–5H are fragmentary cross section diagrams illustrating one example of forming a dual inlaid structure according to the method of FIG. 4.
Figure 5B:
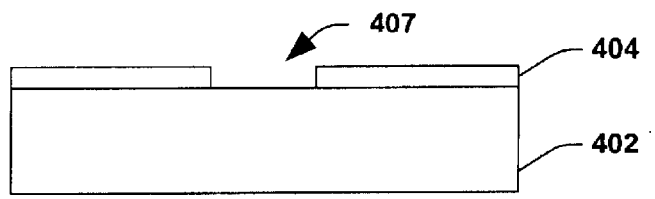
Figure 5C:
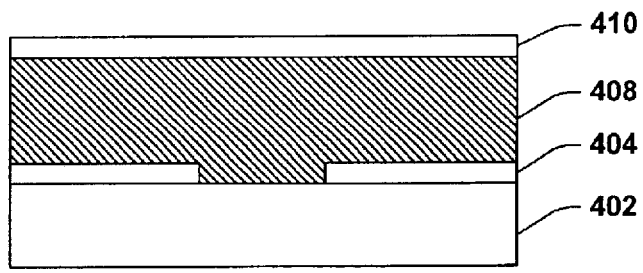
Figure 5D:
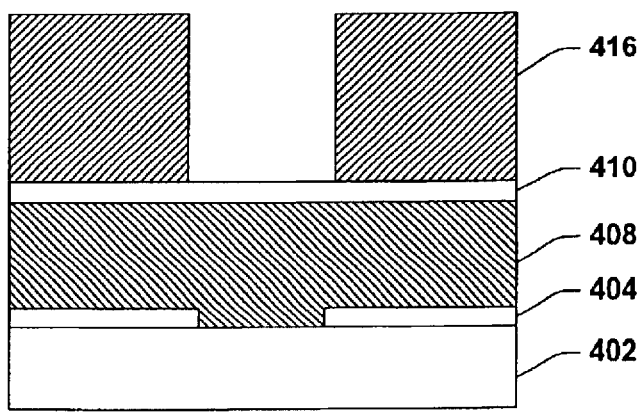

Turning now to FIGS. 5A–5H, cross sectional diagrams are provided illustrating the method 300 of FIG. 4 in accordance with one example. FIGS. 5A through 5H illustrate an exemplary method for a dual inlaid structure according to another aspect of the present invention. In FIG. 5A an etch stop layer, ESL 404, is formed over a substrate 402, and a photoresist 406 is patterned over the ESL 404. Similar to the first example, the ESL 404 is etched to form an opening 407 therein, and the photoresist 406 is stripped in FIG. 5B.

In FIG. 3C an ILD 408 is deposited over the patterned ESL 404 and the substrate 402, followed by a deposition of an MSL 410. A second photoresist 416 is then patterned over the MSL 410 in FIG. 5D. The ILD layer 408, MSL 410, and photoresist 416 can be similar materials as described above with respect to the previous example, however, they may be different and such differences are contemplated by the present invention.

Figure 5E:
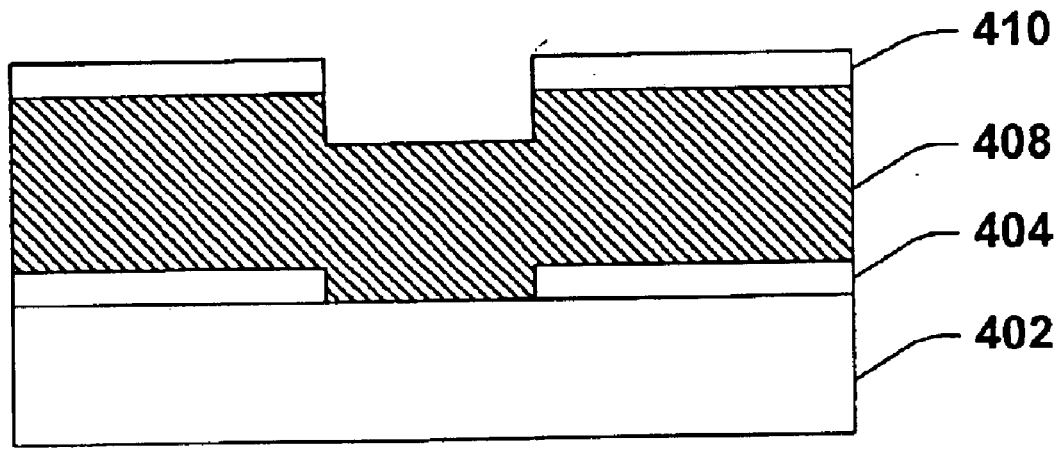
Figure 5F:
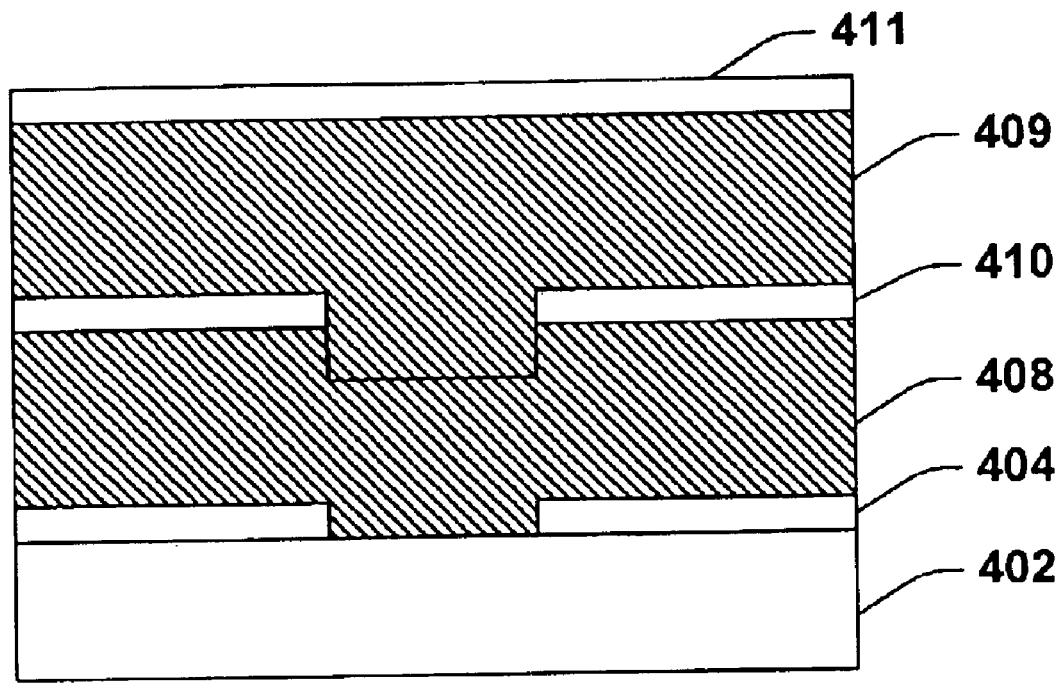

The MSL 410 is then etched as illustrated in FIG. 5E followed by the removal of the photoresist 416 from the MSL 410. The ILD 408 may also be etched partially as shown. The etch is followed by a deposition of a second ILD 409 and a cap layer 411, as illustrated in FIG. 5F. The cap layer 411 can be a single or multi-layer structure. The second ILD 409 and the cap layer 411 can be similar materials as described above with respect to the previous example, as may be desired.

Figure 5G:
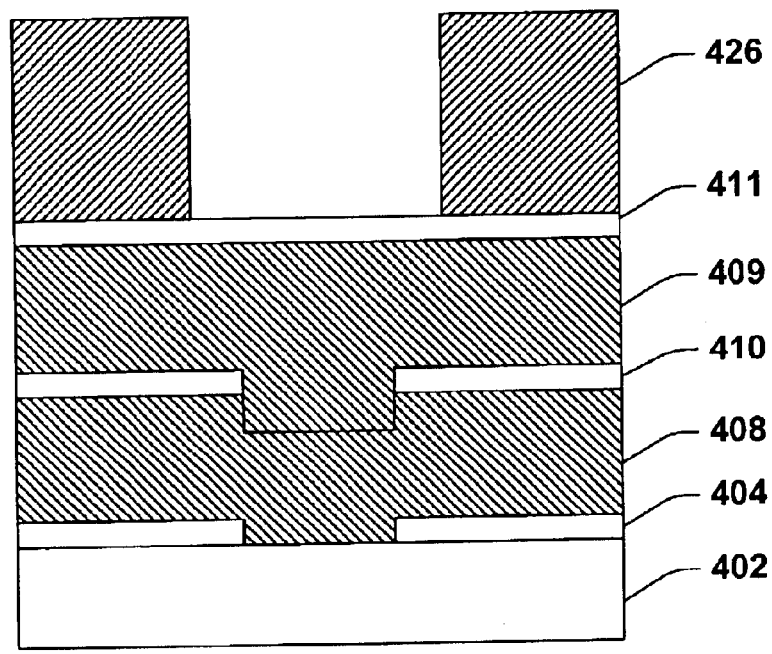

Another photoresist 426 is then formed and patterned over the cap layer 411 in FIG. 5G. The photoresist pattern defines the dimensions of the subsequently formed trench (the via dimensions are defined by the opening previously formed in the MSL 410). An etch is performed to the etch cap layer 411, the ILD 409, and the ILD 408 in FIG. 5H to create the trench and via openings. Note that the etch stops on the MSL and continues through the opening thereof to complete the etch of the first ILD 408 generally over the ESL opening. The etch can be performed using a fluorocarbon-based etch, such as $C_4F_8/O_2/Ar$, followed by an oxidizing etch process such as $O_2/Ar$.

Figure 5H:
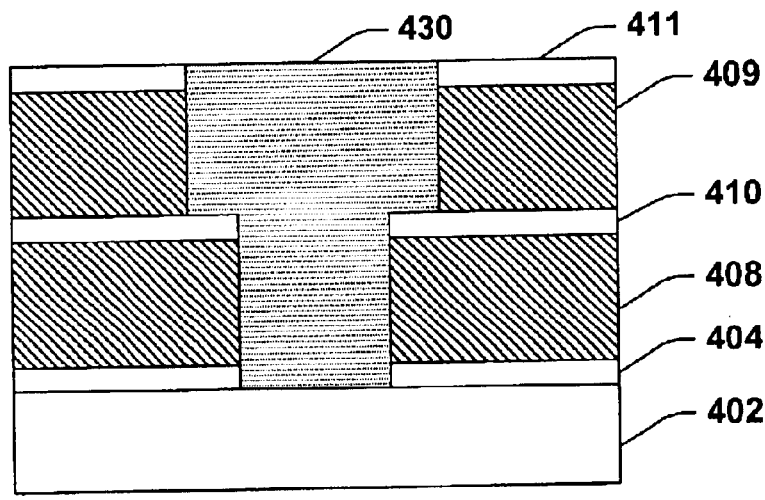

Finally, as illustrated with respect to FIG. 5H, a layer of conductive material 430 is then deposited over the patterned dielectric layer and into the trenches and vias, filling the trenches and vias. Any conductive material on the surface of the cap layer 411 and not in the trenches and vias is then removed, for example, via CMP polishing, leaving the desired pattern of interconnects. The conductive material 430 may be, for example, copper or other suitable conductive material.

FIGS. 6 and 7A–7H illustrate an exemplary method for a dual inlaid structure according to another aspect of the present invention. This example, in addition to the advantages of the examples described above, confines under-layer material (e.g., copper) under a barrier material to reduce electromigration and leakage. Further, this example improves stack performance (i.e., a lower stack dielectric constant) because the ESL thickness of this example does not depend upon the etch stop capability of the ESL.

Figure 6:
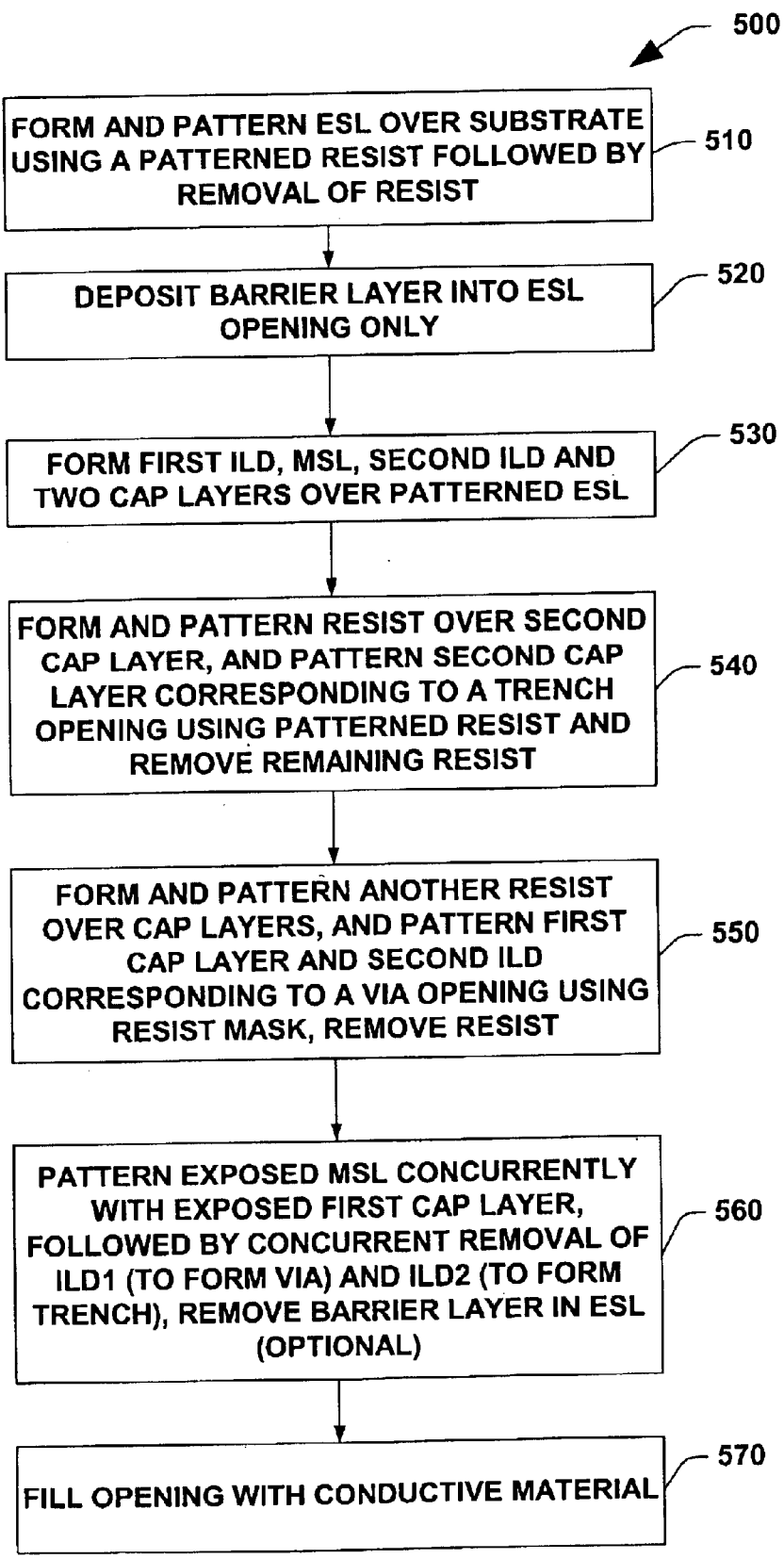
FIG. 6 is a flow chart diagram illustrating a method of forming a dual inlaid structure according to another aspect of the present invention.

FIG. 6 represents a method 500 that is similar in many respects to the method 100 of FIG. 2. That is, act 510 follows the acts 110–140, wherein an ESL layer is formed and patterned using a photoresist that is subsequently removed. Once the photoresist is removed at 510, a barrier layer is deposited only into the ESL opening (in this example) at 520. The method 500 then proceeds at 530 in a manner similar to the method 100, wherein a first ILD, an MSL, a second ILD and two cap layers are formed thereover in succession. The second, or top, cap layer is then patterned with a patterned photoresist serving as a mask to define a trench opening at 540. After patterning, the remaining photoresist is removed. Preferably, the trench opening is aligned substantially with respect to the barrier layer, although the trench opening may be larger than the barrier portion thereunder.

Another photoresist is then formed and patterned over the cap layers and the first, or bottom, cap layer is patterned at 550 using the photoresist as a mask to define a via opening therein, wherein the size of the via opening is smaller than the trench opening. The patterning at 550 extends down through the second ILD and stops on the MSL. The method 500 then continues at 560 by patterning the exposed MSL to define the via, and the exposed first cap layer by using the second cap layer to define the trench. Another etch defines the trench in the second ILD along with a via in the first ILD, which extends down to the barrier. Removing the underlying barrier is optional. The patterning at 560 results in the trench/via structure exposing the underlying substrate, which is then filled with a conductive material at 570 and planarized, for example, via CMP.

Figure 7A:
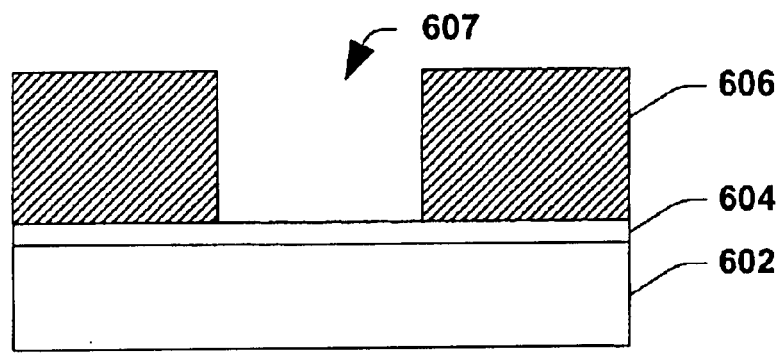
FIGS. 7A–7H are fragmentary cross section diagrams illustrating one example of forming a dual inlaid structure according to the method of FIG. 6.
Figure 7B:
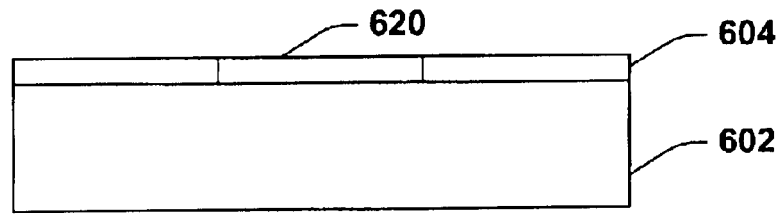

Turning now to FIGS. 7A–7H, cross sectional diagrams are provided illustrating the method 500 of FIG. 6 in accordance with one example. In FIG. 7A an ESL 604, is formed over a substrate 602, and a photoresist 606 is patterned thereover. Similar to the previous examples, the ESL 604 is etched to form an opening 607 in the ESL, and the photoresist 606 is subsequently stripped. In FIG. 7B, a Tantalum (Ta) layer 620, for example, is deposited within the opening 607 formed in the ESL 604 as the barrier.

The Ta layer 620 comprises a barrier layer that prevents copper diffusion and also serves as an etch stop layer. The barrier layer 620 can be formed over the entire surface of the structure and then polished back such that it is only within the opening 607 of the ESL 604. This example offers advantages over conventional methods because the barrier layer 620 provides confinement for under layer copper sputtering and may cause less damage to the ILD sidewalls if it is removed. This further reduces potential electromigration and leakage concerns caused by copper diffusion while preserving the low dielectric constant of the stack. Other materials, such as tantalum alloys, titanium nitride, selective tungsten silicon nitride (WSiN) electro-deposition, or cobalt tungsten phosphorus (CoWP) depositions may be used in addition to or instead of the Ta layer 620 as barriers and are contemplated by the present invention.

Figure 7C:
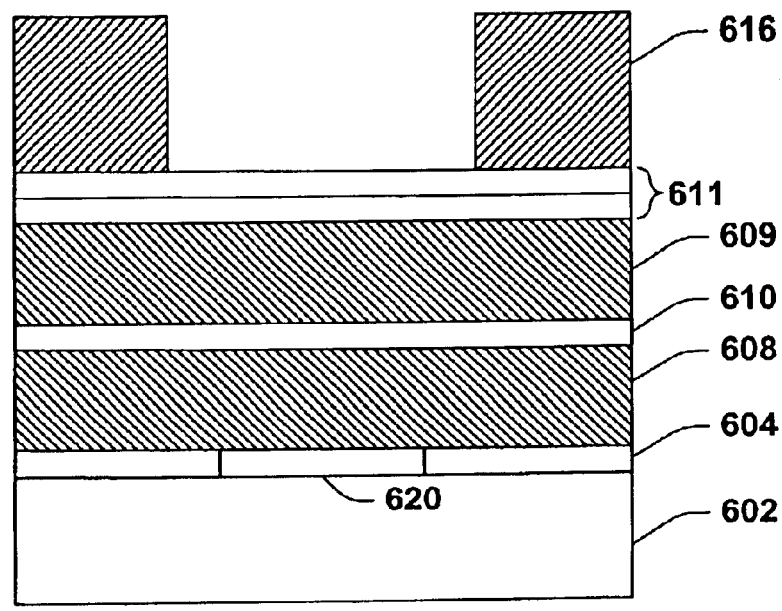

A first ILD layer 608, a MSL 610, a second ILD layer 609, and a cap layer 611 are then deposited over the ESL 604 and the barrier layer 620 in FIG. 7C. These depositions are followed by a photoresist 616 pattern formed over the cap layer 611, as illustrated in FIG. 7C. The first ILD 608, the MSL 610, the second ILD 609, and the cap layer 611 can all be similar materials as described above with respect to the examples described above.

Figure 7D:
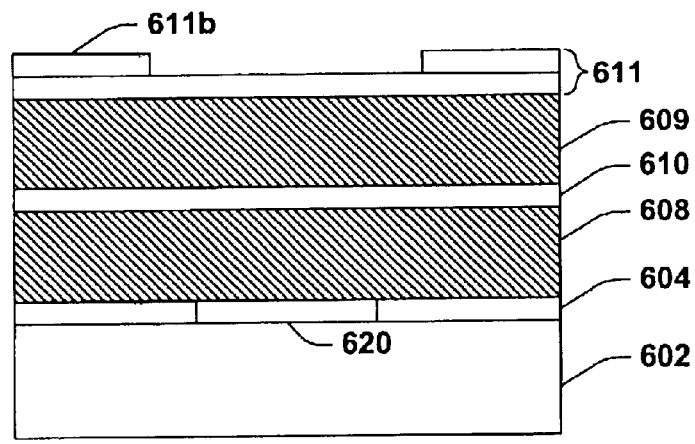
Figure 7E:
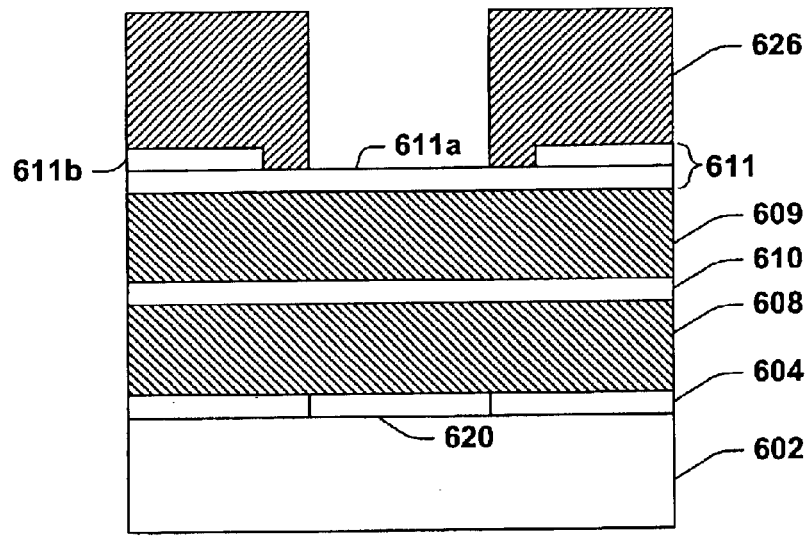
Figure 7F:
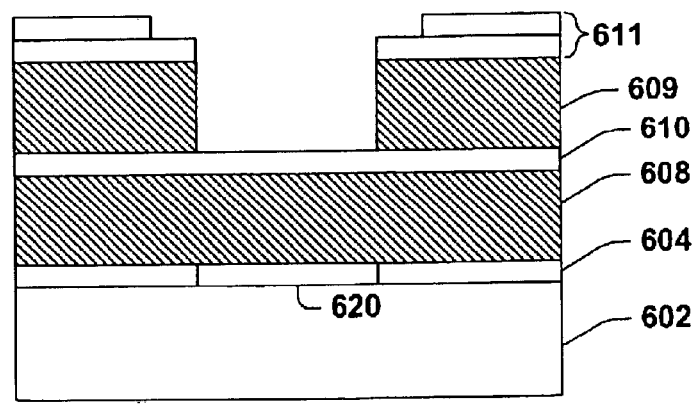

A top portion or top layer 611b of the cap layer 611 is then etched in FIG. 7D and the photoresist 616 subsequently is stripped away. A second photoresist 626 is patterned over the cap layer 611 in FIG. 7E. An etch is then performed in FIG. 7F using a fluorocarbon-based etch (such as CF4/O$_2$/Ar) followed by an oxidizing etch (O2/Ar) in a commercially available plasma etcher to etch away the exposed bottom portion 611a of the cap layer 611 and ILD 609 down to the MSL 610.

Figure 7G:
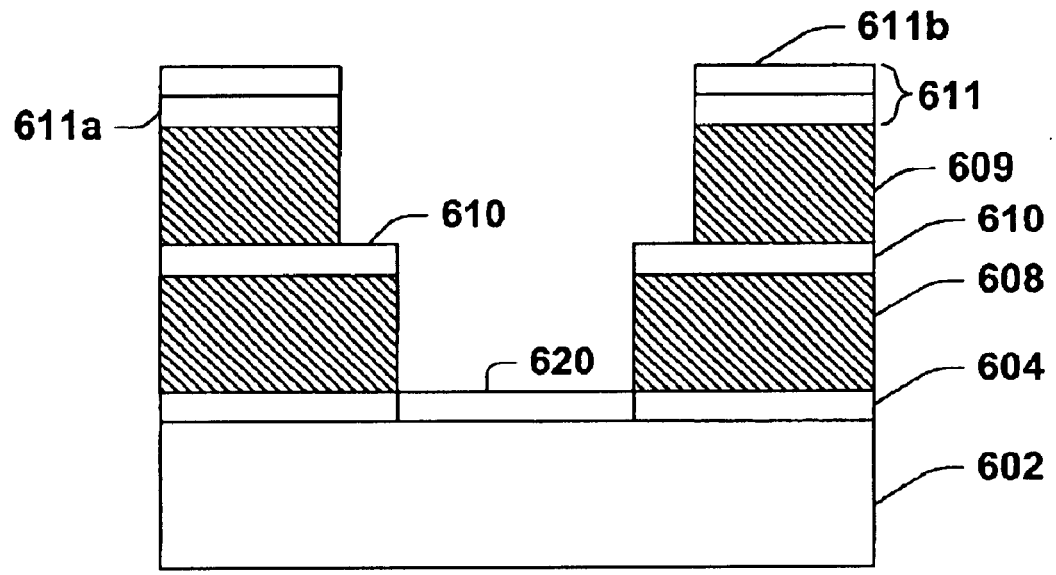

A further etch is then performed in FIG. 7G using a fluorocarbon-based plasma etch such as CH$_2$F$_2$/O$_2$/Ar followed by a reducing etch process such as N$_2$/H$_2$ to etch away the exposed lower portion of the cap layer 611 a concurrently with the exposed portion of the MSL 610, and the first ILD 608 (down to the barrier layer 620) and the second ILD 609 (down to the MSL 610) concurrently in another etch. The barrier layer 620 may then be etched in FIG. 7H, or optionally may be left in place. The barrier layer 620, such as Ta or other suitable material, may etch away without degrading the cap layer 611 and the MSL 610 as severely as in the case of removing the ESL 604 from the via opening with conventional methods. Further, the importance of aligning the various etches with the opening in the ESL 604 is reduced compared to previous embodiments because the addition of the barrier layer 620 will serve as a barrier to copper migration if the etches are offset with respect to the opening of the ESL layer 604 and the barrier layer 620 is not removed.

Figure 7H:
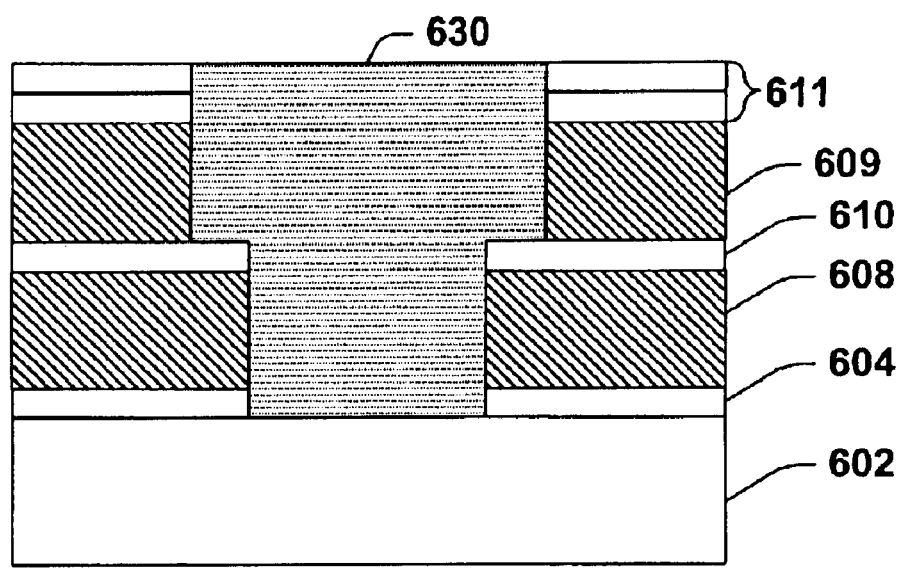

Finally, in FIG. 7H, a conductive material 630, for example, copper, is deposited in the trenches and vias and polished back or removed from the surface conventionally. The aforementioned invention substantially can be applied to other integration methods, such as the one described above in FIGS. 4 and 5A–5H.

FIGS. 8 and 9A–9I illustrate an exemplary method for a dual inlaid structure according to yet another aspect of the present invention. In some examples the ESL material is optimized for low dielectric constant values or EM performance and not limited primarily to etching considerations. In the present example, a first and second ESL are formed, wherein the first ESL is optimized for the stack dielectric constant and EM concerns, and the second ESL is optimized and employed for etch performance. The second ESL can be deposited and patterned only in predetermined areas, where the etch rate is fast or the etch selectivity is low and the etch may otherwise etch through the ESL. For example, near the die seal or die lithography alignment marks, the ESL can etch faster than in other areas of the die. The portions that etch faster may cause a build-up of electrical charge that, in addition to the etch-through problem, may cause conductor charging and a possible explosion. Therefore, one may want to increase the thickness of the ESL in areas where the etch performs more rapidly.

Figure 8:
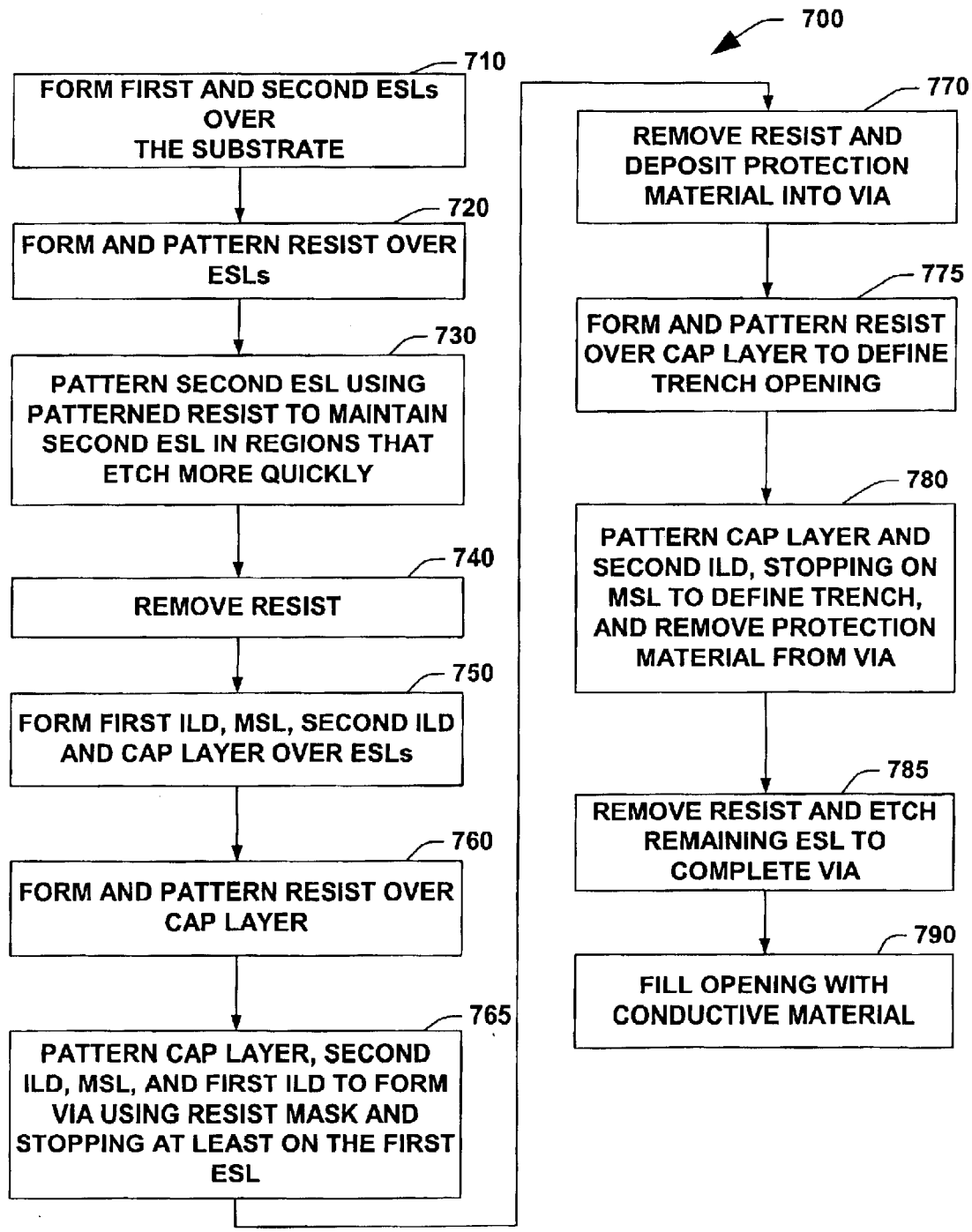
FIG. 8 is a flow chart diagram illustrating a method of forming a dual inlaid structure according to yet another aspect of the present invention.

In FIG. 8, a method 700 is illustrated wherein first and second ESLs are formed over a substrate in succession at 710. A resist is formed thereover and patterned at 720 to define areas where the second ESL should remain. For example, a region near the die seal or near lithography alignment marks that may etch more quickly with a traditional etch processing sequence. By etching the second ESL selectively, a portion of the second ESL will remain in one or more areas that tends to etch more quickly. Therefore during subsequent processing, as will be describe in greater detail below, the remaining second ESL portion is available during trench or via patterning to help prevent an undesirable punchthrough into the underlying substrate. The second ESL is then selectively patterned using the resist mask at 730.

The patterned resist is removed at 740, and a first ILD, an MSL, a second ILD and a cap layer are formed over the first and second ESLs in succession at 750. Another photoresist is then formed and patterned over the cap layer at 760 to define areas where a via is to be formed. The cap layer, second ILD, MSL and first ILD are then patterned at 765 using the patterned resist as a mask. In areas where such an etch tends to occur quickly, both the second and first ESL reside thereat, thereby preventing the etch to extend through the first ESL and thus preventing an undesirable punch-through condition. In areas where the etch occurs less quickly, the first ESL serves to stop the etch. Thus in both areas, the trench or via etch stops at least on a portion of the first ESL.

The patterned resist is then removed and a protection material, such as an organic barc material is formed in the via at 770 using, for example, a spin-on deposition technique. The protection material overlies the exposed ESLs in the vias to protect the ESLs during subsequent trench processing, as will be further appreciated below. Another resist is formed and patterned over the cap layer to define a trench opening at 775, and the cap layer and the second ILD are patterned (stopping on the MSL) to define the trench at 780. Concurrently, the trench formation results in deterioration or complete removal of the protection layer within the via, wherein the underlying ESLs were protected.

The patterned resist is then removed, and the remaining ESLs are removed and the trench/via opening is completed at 785, followed by a filling of the trench or via with a conductive material at 790.

Turning now to FIGS. 9A–9I, cross sectional diagrams are provided illustrating the method 700 of FIG. 8 in accordance with one example. In some examples, the ESL material is optimized for low dielectric constant values and EM performance and not limited primarily to etching considerations. In the present example, a first and second ESL are formed, the first ESL optimized for the stack dielectric constant, the second ESL optimized and employed primarily for etch performance. The second ESL can be deposited and patterned only in predetermined areas, where the etch selectivity is low and the etch may etch through the ESL, for example, near the die seal or die lithography alignment marks, where the full stack etch process can etch significantly faster than in other areas. The portions that etch faster may cause a build-up of electrical charge that, in addition to the etch through problem, may cause conductor charging and a possible explosion. Therefore, one may want to increase the thickness of the ESL in areas where the etch performs more rapidly.

Figure 9A:
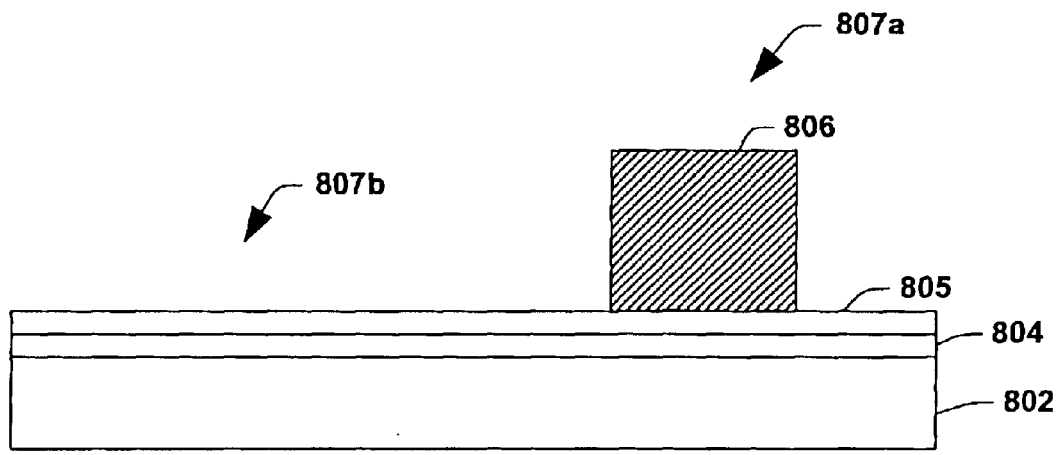
FIGS. 9A–9I are fragmentary cross section diagrams illustrating one example of forming a dual inlaid structure according to the method of FIG. 8.
Figure 9B:
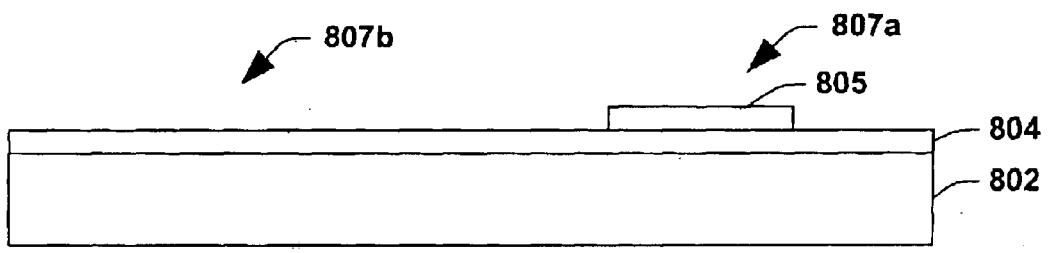

In FIG. 9A a first and second ESL layer, ESL1 804 and ESL2 805, are formed over the substrate 802. A photoresist 806 is then patterned over the ESL2 805 to pattern the ESL2 805 such that it covers those areas 807a that etch more quickly. An ESL2 etch is then performed and the photoresist 806 is stripped away leaving the desired pattern of ESL2 805 on ESL1 804 as shown in FIG. 9B, wherein the ESL2 remains in an area 807a and is removed in an area 807b. ESL1 804 and ESL2 805 may be similar or dissimilar materials with similar or dissimilar etch characteristics. In one example, the ESL may be deposited with greater thickness (e.g., by patterning a second layer) in those areas where the etch performs more quickly. Using multiple ESLs or a varying thickness ESL offers several advantages over a single uniform thickness ESL. In one example, two different ESL materials with different etch selectivities can be used to allow for accurately stopping an etch at the ESL1 804 when patterning the ESL2 805. Further, in one example, the ESL1 804 has a lower dielectric constant than the ESL2 805, reducing the overall dielectric constant of the stack, because only the ESL1 804 will ultimately contribute to the final dielectric constant of the stack and the ESL2 805 will be removed.

Figure 9C:
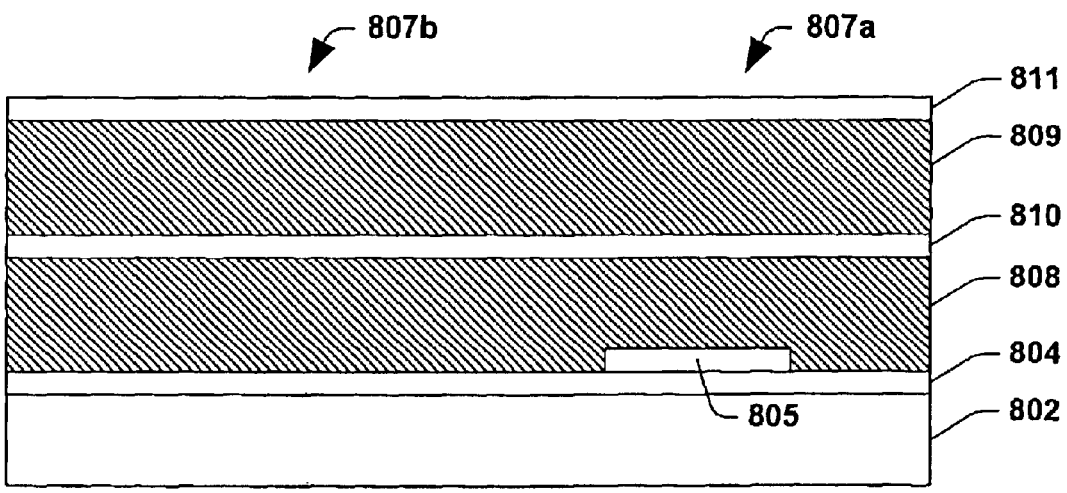

A first ILD layer 808, an MSL 810, a second ILD 809, and a cap layer 811 are then deposited over the ESL1 804 and the ESL2 805, as illustrated in FIG. 9C. These depositions are followed by a photoresist 816 pattern formed over the cap layer 811. The first ILD layer 808, the MSL 810, the second ILD 809, and the cap layer 811 can be formed of similar materials as described above in the first and second examples.

Figure 9D:
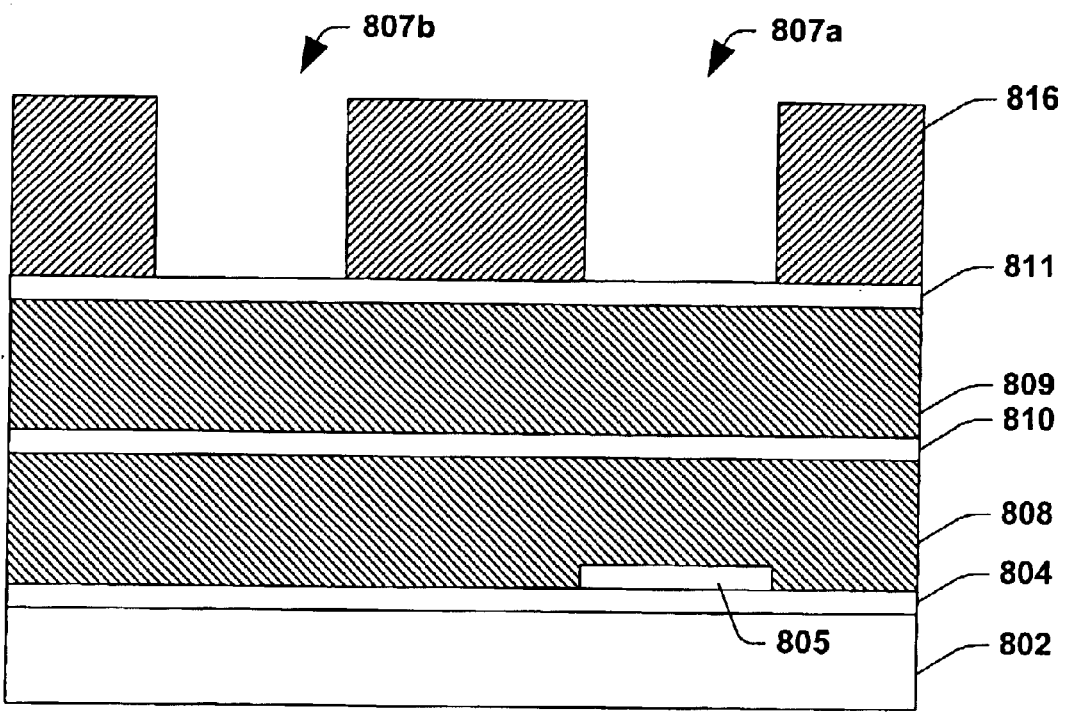
Figure 9E:
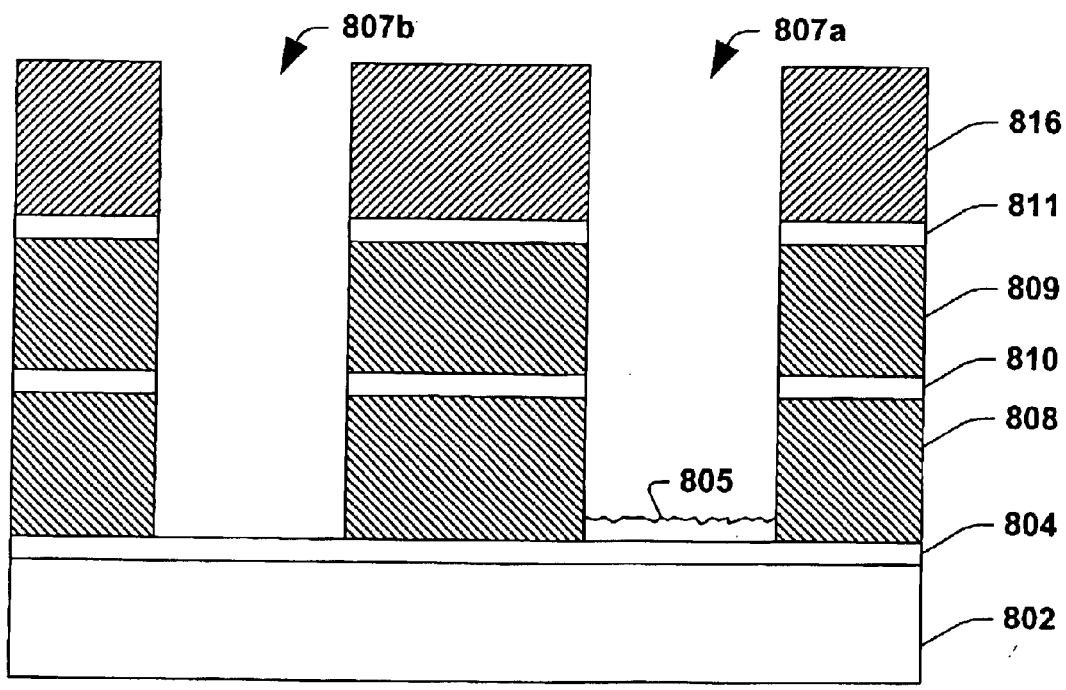

The cap layer 811, the second ILD layer 809, the MSL 810, and the first ILD 808 are then etched in FIG. 9D to form vias in areas 807a and 807b. The ESL2 805 is formed in area 807a such that the etch does not etch into the ESL1 804, or at least does not etch completely through the ESL1 804. The ESL2 805 may be partially or completely etched during the via etch, as illustrated in area 807a of FIG. 9E.

Figure 9F:
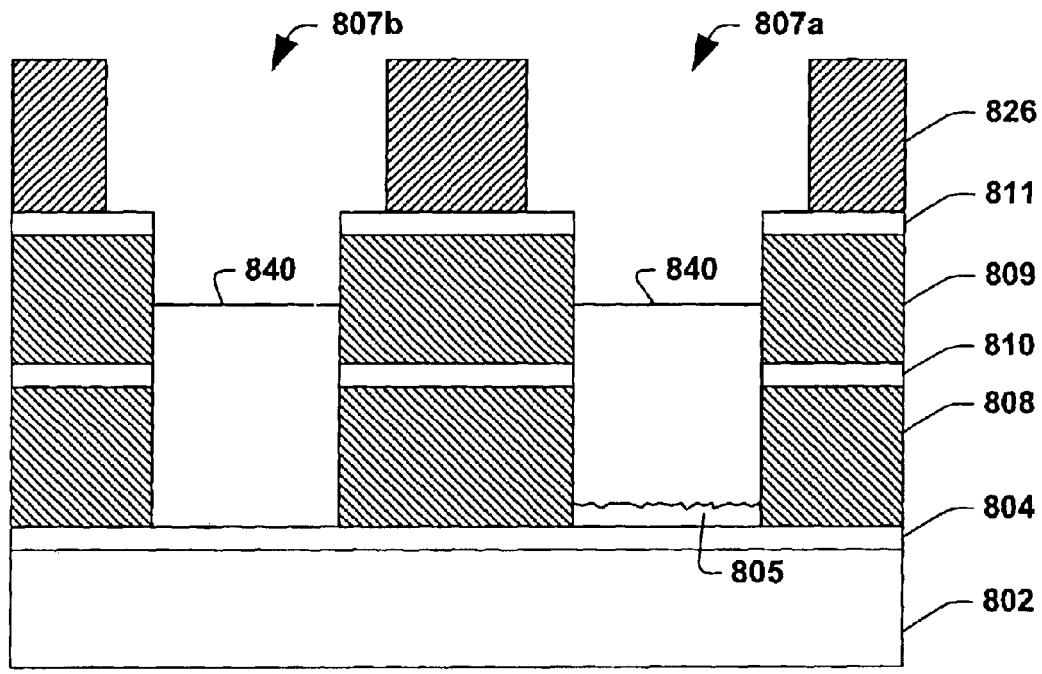

Another photoresist 826 is then patterned over the cap layer 811 to define the trench openings. Additionally, an etch stop layer protection material 840 is deposited into the via opening to protect the ESL (ESL1 804 and any remaining ESL2 805) from the effects of etching the cap layer 811 and the second ILD layer 809 when forming the trench, as illustrated in FIG. 9F. The ESL protection material 840 comprises, for example, a spin-on organic bottom antireflective coating "BARC" or other suitable material to protect the ESL1 804 and the ESL2 805 from the being etched completely away.

Figure 9G:
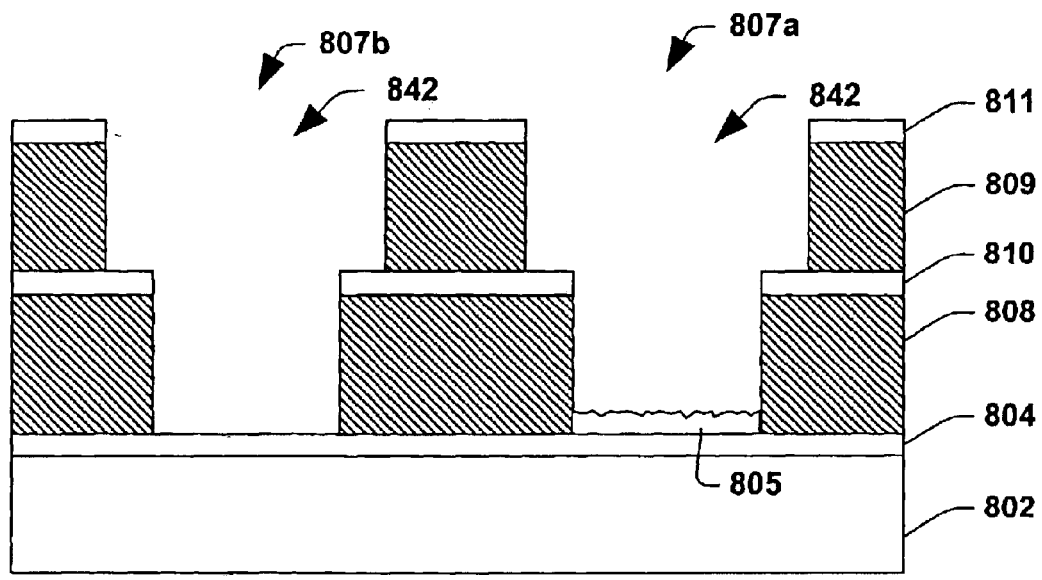
Figure 9H:
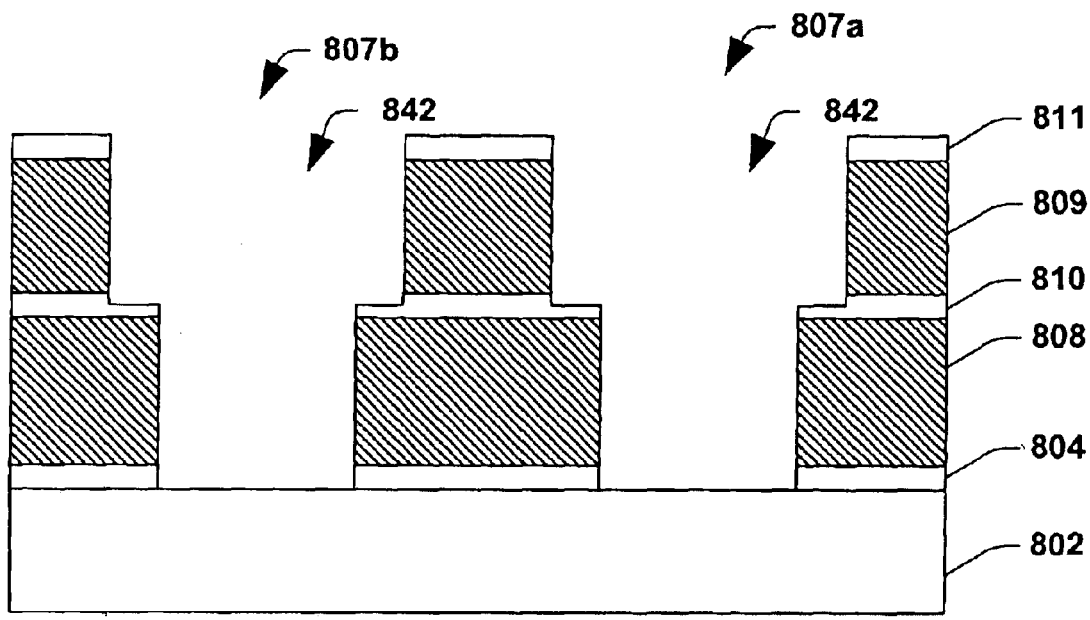
Figure 9I:
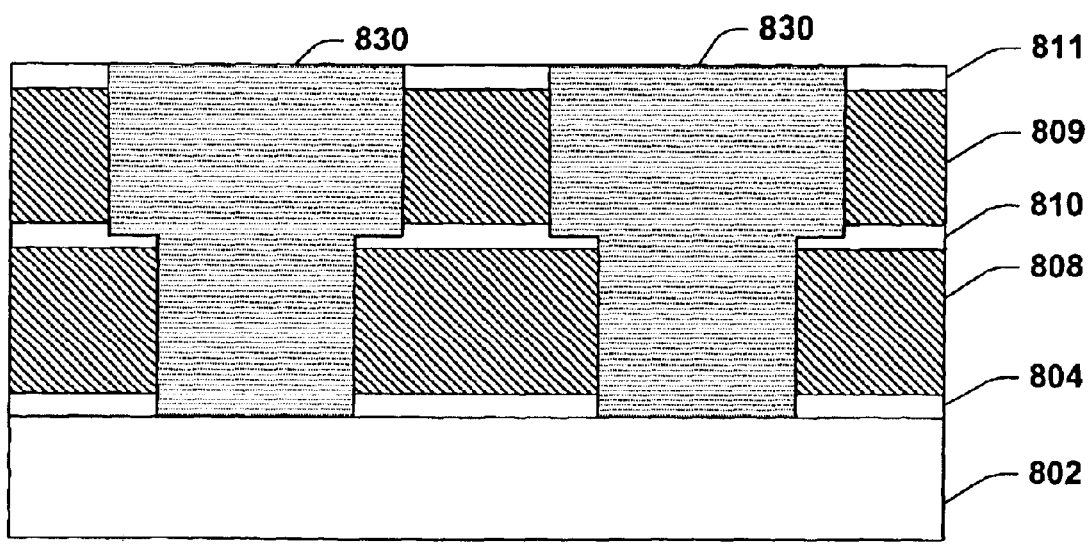

The photoresist 826 and the ESL protection material 840 are removed in FIG. 9G. Then the ESL1 804, and any remaining ESL2 805 are etched from the via openings to form a completed trench and via structure 842 in the areas 807a and 807b, respectively. In FIG. 9H, the ESL1 804 and the ESL2 805 are etched to form completed vias. A conductive material 830, for example, is then deposited in the trench/via structures 842 and polished back or removed from the surface conventionally, as illustrated in FIG. 9I.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

We claim:

1. A method for forming a structure, comprising:
   forming an etch stop layer over a substrate;
   forming an opening through the etch stop layer;
   forming a first layer of dielectric material over the etch stop layer and the opening formed therethrough;
   forming a middle stop layer over the first layer of dielectric material;
   forming a second layer of dielectric material over the middle stop layer;
   forming a via opening down to the substrate through the second layer of dielectric material, the middle stop layer and the first layer of dielectric material, the via opening associated with the opening in the etch stop layer and having a first size;
   forming a trench opening down to the middle stop layer through the second layer of dielectric material, the trench opening having a second size that is greater than the first size; and
   filling the via or trench with a conductive material.

2. The method of claim 1, wherein forming the via opening and the trench opening comprises:
   forming a first cap layer over the second layer of dielectric material;
   forming a second cap layer over the first cap layer;
   patterning the second cap layer to form an opening therein, wherein the opening in the second cap layer corresponds to the size of the trench;
   patterning the first cap layer to form an opening therein, wherein the opening in the first cap layer corresponds to the size of the via;
   using the patterned first and second cap layers as masks to form the via and trench, respectively.

3. The method of claim 1, wherein forming the opening in the etch stop layer comprises:
   forming a photoresist over the etch stop layer;
   patterning the photoresist to form an opening therethrough;
   etching the opening in the etch stop layer using the patterned photoresist as a mask; and
   removing the patterned photoresist.

4. The method of claim 3, wherein the photoresist mask comprises a single layer of photoresist.

5. The method of claim 1, further comprising:
   forming a barrier layer within the opening of the etch stop layer prior to forming the first layer of dielectric material over the etch stop layer.

6. The method of claim 5, further comprising planarizing the barrier layer with respect to the etch stop layer such that the barrier layer resides substantially within the opening in the etch stop layer.

7. The method of claim 6, wherein the barrier layer comprises tantalum.

8. The method of claim 1, wherein the first or second layer of dielectric material comprises SiLK.

9. The method of claim 1, wherein the first or second layer of dielectric material has a dielectric constant of about 3.0 or less.

10. The method of claim 2, wherein the first and second cap layers have a combined thickness of less than about 2000 Angstroms.

11. The method of claim 1, wherein the middle stop layer comprises SiN and has a thickness of about 500 Angstroms or less.

12. A method for forming an interconnect associated with an integrated circuit structure, comprising:
   forming an etch stop layer over the integrated circuit structure associated with a substrate;
   forming an opening through the etch stop layer;
   forming a first layer of dielectric material over the etch stop layer and the opening formed therethrough;
   forming a middle stop layer over the first layer of dielectric material;
   forming an opening through the middle stop layer that is aligned substantially with respect to the opening in the etch stop layer;

forming a second layer of dielectric material over the middle stop layer having the opening formed therethrough;

forming a cap layer over the second layer of dielectric material;

forming a trench opening in the cap layer, the trench opening aligned substantially with respect to the openings in the middle stop layer and the etch stop layer, respectively;

forming a trench in the second layer of dielectric material through the trench opening, the trench extending down to the middle stop layer, and forming a via in the first layer of dielectric material through the middle stop layer opening, the via extending down through the opening to the substrate; and filling the via and trench with a conductive material.

13. The method of claim 12, wherein forming the opening in the etch stop layer comprises:

forming a photoresist over the etch stop layer;

patterning the photoresist to form an opening therethrough;

etching the opening in the etch stop layer using the patterned photoresist as a mask; and removing the patterned photoresist.

14. The method of claim 12, wherein forming the trench opening and the via opening in the cap layer comprises:

forming a photoresist over the cap layer;

patterning the photoresist to define a trench opening therethrough, the trench opening in the photoresist corresponding generally to the opening in the etch stop layer; and etching the cap layer using the patterned photoresist as a mask.

15. The method of claim 12, further comprising forming a barrier layer within the opening of the etch stop layer prior to forming the first layer of dielectric material over the etch stop layer.

16. The method of claim 15, further comprising planarizing the barrier layer with respect to the etch stop layer such that the barrier layer resides within the opening in the etch stop layer.

17. The method of claim 15, wherein the barrier layer comprises tantalum.

18. The method of claim 12, wherein the first or second layer of dielectric material comprises SiLK.

19. The method of claim 12, wherein the first or second dielectric material has a dielectric constant of about 3.0 or less.

20. The method of claim 12, wherein the first and second cap layers have a combined thickness of less than about 1000 Angstroms.

21. A method for forming an interconnect associated with an integrated circuit structure comprising:

forming a first etch stop layer over an integrated circuit structure associated with a substrate;

forming a second etch stop layer on the first etch stop layer;

patterning a portion of the second etch stop layer, thereby defining a first region having the first etch stop layer and a second region having the second etch stop layer overlying the first etch stop layer, and wherein the second region is a region that experiences etching at a rate that is greater than the first region;

forming a first layer of dielectric material, a middle stop layer, a second layer of dielectric material and a cap layer successively over the first and second regions;

patterning the cap layer, the second layer of dielectric material, the middle stop layer and the first layer of dielectric material to define two via openings, wherein a first via opening is in the first region and a second via opening is in the second region, and both the first and second via openings extend down to the first etch stop layer;

filling the via opening with a protection material;

patterning the cap layer to define first and second trench openings therein generally corresponding to the first and second via openings, wherein the first and second trench openings are larger than the first and second via openings;

patterning the second layer of dielectric material to define first and second trenches therein using the patterned cap layer, stopping on the middle stop layer, wherein the protection material protects the etch stop layer in the first and second via openings;

removing any remaining photoresist and the protection material from the first and second via openings;

removing the first etch stop layer within the first via opening and the first and second etch stop layers from within the second via opening; and filling the two vias and trenches with a conductive material.

22. The method of claim 21, wherein patterning a portion of the second etch stop layer comprises:

forming a photoresist over the second etch stop layer;

patterning the photoresist to define the first region;

etching the first region in the second etch stop layer using the patterned photoresist as a mask; and removing the patterned photoresist.

23. The method of claim 21, wherein patterning the cap layer, first and second layers of dielectric material and the middle stop layer comprises:

forming a photoresist over the cap layer;

patterning the photoresist to form two openings therethrough, the openings in the photoresist corresponding to first and second via openings associated with the first region and the second region, respectively;

etching the cap layer, the first and second layers of dielectric material and the middle stop layer using the patterned photoresist as a mask; and removing the patterned photoresist.

24. The method of claim 23, wherein etching the cap layer, the first and second dielectric layers and the middle stop layer to define the second via opening in the second region is stopped or slowed by the second etch stop layer within the second opening.

25. The method of claim 21, wherein the first and second etch stop layers are of the same material.

26. The method of claim 21, wherein the first and second etch stop layers are different materials.

27. The method of claim 21, wherein the first and second etch stop layers are materials having different etch selectivities.

28. The method of claim 21, wherein the first etch stop layer comprises a different material having a lower dielectric constant than that of the second etch stop layer.

29. The method of claim 21, further comprising selecting a thickness of the first stop layer to prevent subsequent electromigration of the conductive material.

* * * * *